(12) United States Patent
Kim et al.

(10) Patent No.: US 8,008,758 B1
(45) Date of Patent: Aug. 30, 2011

(54) SEMICONDUCTOR DEVICE WITH INCREASED I/O LEADFRAME

(75) Inventors: Gi Jeong Kim, Guri-si (KR); Wan Jong Kim, Goyang-si (KR)

(73) Assignee: Amkor Technology, Inc., Chandler, AZ (US)

( * ) Notice: Subject to any disclaimer, the term of this patent is extended or adjusted under 35 U.S.C. 154(b) by 433 days.

(21) Appl. No.: 12/259,096

(22) Filed: Oct. 27, 2008

(51) Int. Cl.
*H01L 23/495* (2006.01)

(52) U.S. Cl. ............... 257/676; 257/E23.047; 257/666; 438/123

(58) Field of Classification Search ........... 257/E23.047, 257/E23.124, E23.126, 666, 670, 676–680, 257/782, 783; 438/123, 106, 118, 121, 125; 235/487, 492
See application file for complete search history.

(56) References Cited

U.S. PATENT DOCUMENTS

| | | | |
|---|---|---|---|
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,221,925 A | 9/1980 | Finley et al. | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Chris Chu
(74) *Attorney, Agent, or Firm* — Stetina Brunda Garred & Brucker

(57) ABSTRACT

In accordance with the present invention, there is provided a semiconductor package (e.g., a QFP package) including a uniquely configured leadframe sized and configured to maximize the available number of exposed leads in the semiconductor package. More particularly, the semiconductor package of the present invention includes a generally planar die pad or die paddle defining multiple peripheral edge segments. In addition, the semiconductor package includes a plurality of leads. Some of these leads include exposed bottom surface portions which are provided in at least one row or ring which at least partially circumvents the die pad, with other leads including portions which protrude from respective side surfaces of a package body of the semiconductor package. Connected to the top surface of the die pad is at least one semiconductor die which is electrically connected to at least some of the leads. At least portions of the die pad, the leads, and the semiconductor die are encapsulated by the package body, with at least portions of the bottom surfaces of the die paddle and some of the leads being exposed in a common exterior surface of the package body.

21 Claims, 28 Drawing Sheets

U.S. PATENT DOCUMENTS

| | | | |
|---|---|---|---|
| 4,727,633 A | 3/1988 | Herrick |
| 4,737,839 A | 4/1988 | Burt |
| 4,756,080 A | 7/1988 | Thorpe, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, III et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,434,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,767,566 A | 6/1998 | Suda |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davies et al. |
| 5,817,540 A | 10/1998 | Wark |
| 5,818,105 A | 10/1998 | Kouda |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,511 A | 12/1998 | Shin et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,973,935 A | 10/1999 | Schoenfeld et al. |
| 5,977,630 A | 11/1999 | Woodworth et al. |
| RE36,773 E | 7/2000 | Nomi et al. |
| 6,107,679 A | 8/2000 | Noguchi |
| 6,143,981 A | 11/2000 | Glenn |
| 6,150,709 A | 11/2000 | Shin et al. |
| 6,157,074 A | 12/2000 | Lee |
| 6,166,430 A | 12/2000 | Yamaguchi |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |

| Patent | Date | Inventor |
|---|---|---|
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,238,952 B1 | 5/2001 | Lin et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,261,864 B1 | 7/2001 | Jung et al. |
| 6,281,566 B1 | 8/2001 | Magni |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,306,685 B1 | 10/2001 | Liu et al. |
| 6,307,272 B1 | 10/2001 | Takahashi et al. |
| 6,309,909 B1 | 10/2001 | Ohgiyama |
| 6,316,822 B1 | 11/2001 | Vekateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,252 B1 | 1/2002 | Niones et al. |
| 6,339,255 B1 | 1/2002 | Shin |
| 6,342,730 B1 | 1/2002 | Jung et al. |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,423,643 B1 | 7/2002 | Furuhata et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijinders |
| 6,465,883 B2 | 10/2002 | Olofsson |
| 6,472,735 B2 | 10/2002 | Isaak |
| 6,475,646 B2 | 11/2002 | Park et al. |
| 6,476,469 B2 | 11/2002 | Huang et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori et al. |
| 6,495,909 B2 | 12/2002 | Jung et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,528,893 B2 | 3/2003 | Jung et al. |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,585,905 B1 | 7/2003 | Fan et al. |
| 6,603,196 B2 | 8/2003 | Lee et al. |
| 6,624,005 B1 | 9/2003 | DiCaprio et al. |
| 6,627,977 B1 | 9/2003 | Foster |
| 6,630,373 B2 * | 10/2003 | Punzalan et al. ............... 438/123 |
| 6,646,339 B1 | 11/2003 | Ku |
| 6,667,546 B2 | 12/2003 | Huang et al. |
| 6,677,663 B1 | 1/2004 | Ku et al. |
| 6,686,649 B1 | 2/2004 | Matthews et al. |
| 6,696,752 B2 | 2/2004 | Su et al. |
| 6,700,189 B2 | 3/2004 | Shibata |
| 6,713,375 B2 | 3/2004 | Shenoy |
| 6,757,178 B2 | 6/2004 | Okabe et al. |
| 6,800,936 B2 | 10/2004 | Kosemura et al. |
| 6,812,552 B2 | 11/2004 | Islam et al. |
| 6,818,973 B1 * | 11/2004 | Foster ........................ 257/676 |
| 6,858,919 B2 | 2/2005 | Seo et al. |
| 6,867,492 B2 | 3/2005 | Auburger et al. |
| 6,876,068 B1 | 4/2005 | Lee et al. |
| 6,878,571 B2 | 4/2005 | Isaak et al. |
| 6,897,552 B2 | 5/2005 | Nakao |
| 6,911,718 B1 * | 6/2005 | Alegre et al. ................. 257/666 |
| 6,927,478 B2 | 8/2005 | Paek |
| 6,967,125 B2 | 11/2005 | Fee et al. |
| 6,995,459 B2 | 2/2006 | Lee et al. |
| 7,002,805 B2 | 2/2006 | Lee et al. |
| 7,005,327 B2 | 2/2006 | Kung et al. |
| 7,015,571 B2 | 3/2006 | Chang et al. |
| 7,045,396 B2 | 5/2006 | Crowley et al. |
| 7,053,469 B2 | 5/2006 | Koh et al. |
| 7,075,816 B2 | 7/2006 | Fee et al. |
| 7,102,209 B1 | 9/2006 | Bayan et al. |
| 7,109,572 B2 | 9/2006 | Fee et al. |
| 7,185,426 B1 | 3/2007 | Hiner |
| 7,193,298 B2 * | 3/2007 | Hong et al. ................... 257/666 |
| 7,211,471 B1 | 5/2007 | Foster |
| 7,245,007 B1 | 7/2007 | Foster |
| 7,253,503 B1 | 8/2007 | Fusaro et al. |
| 7,847,392 B1 * | 12/2010 | Choi et al. ................... 257/696 |
| 7,875,963 B1 * | 1/2011 | Kim et al. .................... 257/670 |
| 2001/0008305 A1 | 7/2001 | McClellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0072147 A1 | 6/2002 | Sayanagi et al. |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |
| 2002/0167060 A1 | 11/2002 | Buijsman et al. |
| 2003/0006055 A1 | 1/2003 | Chien-Hung et al. |
| 2003/0030131 A1 | 2/2003 | Lee et al. |
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan et al. |
| 2003/0164554 A1 | 9/2003 | Fee et al. |
| 2003/0168719 A1 | 9/2003 | Cheng et al. |

| | | | |
|---|---|---|---|
| 2003/0198032 A1 | 10/2003 | Collander et al. | |
| 2004/0027788 A1 | 2/2004 | Chiu et al. | |
| 2004/0056277 A1 | 3/2004 | Karnezos | |
| 2004/0061212 A1 | 4/2004 | Karnezos | |
| 2004/0061213 A1 | 4/2004 | Karnezos | |
| 2004/0063242 A1 | 4/2004 | Karnezos | |
| 2004/0063246 A1 | 4/2004 | Karnezos | |
| 2004/0065963 A1 | 4/2004 | Karnezos | |
| 2004/0080025 A1 | 4/2004 | Kasahara et al. | |
| 2004/0089926 A1 | 5/2004 | Hsu et al. | |
| 2004/0097016 A1 | 5/2004 | Yee et al. | |
| 2004/0164387 A1 | 8/2004 | Ikenaga et al. | |
| 2004/0253803 A1 | 12/2004 | Tomono et al. | |
| 2005/0199987 A1 | 9/2005 | Danno et al. | |
| 2006/0087020 A1 | 4/2006 | Hirano et al. | |
| 2006/0157843 A1 | 7/2006 | Hwang | |
| 2006/0231939 A1 | 10/2006 | Kawabata et al. | |
| 2007/0023202 A1 | 2/2007 | Shibata | |
| 2008/0036051 A1* | 2/2008 | Espiritu et al. | 257/666 |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6-252333 | 9/1994 |
| JP | 6252333 | 9/1994 |
| JP | 6260532 | 9/1994 |
| JP | 7297344 | 11/1995 |
| JP | 7312405 | 11/1995 |
| JP | 8064634 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 2001060648 | 3/2001 |
| JP | 2002519848 | 7/2002 |
| JP | 2002043497 | 8/2002 |
| JP | 2003243595 | 8/2003 |
| JP | 2004158753 | 6/2004 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

SEMICONDUCTOR DEVICE WITH INCREASED I/O LEADFRAME

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit package technology and, more particularly, to an increased capacity QFP semiconductor package which includes exposed leads and an exposed die pad on the bottom surface of the package body thereof, and additional leads which protrude from side surfaces of the package body.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die pad of the leadframe also remains exposed within the package body.

Leadframes for semiconductor packages can be largely classified into copper-based leadframes (copper/iron/phosphorous; 99.8/0.01/0.025), copper alloy-based leadframes (copper/chromium/tin/zinc; 99.0/0.25/0.22), alloy 42-based leadframes (iron/nickel; 58.0/42.0), etc. according to the composition of the elements or materials included in the leadframe. Exemplary semiconductor packages or devices employing leadframes include a through-hole mounting dual type inline package (DIP), a surface mounting type quad flat package (QFP), and a small outline package (SOP).

As indicated above, one type of semiconductor package commonly including a leadframe is a quad flat pack (QFP) package. QFP semiconductor packages or devices are particularly advantageous for their smaller size and superior electrical performance. A typical QFP package comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is itself mounted to a die pad of the QFP package leadframe. In certain types of QFP packages referred to as QFP exposed pad packages, one surface of the die pad is exposed within the bottom surface of the package body.

In the electronics industry and, in particular, in high frequency applications such hard disk drives, digital television and other consumer electronics, there is an increasing need for QFP exposed pad packages of increased functional capacity, coupled with reduced size and weight. One of the deficiencies of currently known QFP packages is attributable to the length at which the leads protrude from the sides of the package body, such protrusion length resulting in an increase in the overall size of the QFP package and further limiting the number of inputs/outputs (I/O's) which may be included therein. With recent trends toward high integration and high performance semiconductor dies, there is a need for QFP packages to have a larger number of I/O's with excellent thermal and electrical properties. In view of this need, conventional leadframe structures as currently known and integrated into existing QFP packages often prove to be unsatisfactory.

In an attempt to address some of the deficiencies highlighted above in relation to QFP packages, there has been developed in the prior art ball grid array (BGA) and pin grid array (PGA) semiconductor packages or devices which employ the use of laminate, tape, or film circuit boards as opposed to leadframes. These particular types of semiconductor packages provide a relatively large number of I/O's, such I/O's being defined by solder balls or metal pins which are formed on a lower surface of the encapsulant or package body of the package, rather than on the side surfaces of the package body. However, the circuit boards integrated into these types of semiconductor packages are expensive and typically exhibit poor heat sink and electrical performance characteristics in comparison to semiconductor packages employing leadframes. In this regard, semiconductor packages or devices employing leadframes often exhibit good heat sink performance due to the semiconductor die being directly mounted on a metal (e.g., copper) die pad of the leadframe. Further, the die pad of the leadframe can be used as a ground area to improve the electrical properties of the semiconductor package. Such a structure is difficult to achieve in a semiconductor package employing a circuit board.

The present invention provides a QFP exposed pad package which addresses the aforementioned needs by providing increased I/O with a reduced overall size. The QFP package of the present invention includes exposed leads and an exposed die pad on the bottom surface of the package body thereof, and additional leads which protrude from side surfaces of the package body. The QFP package of the present invention is also provided through the use of standard, low-cost leadframe design techniques. These, as well as other features and attributes of the present invention will be discussed in more detail below.

BRIEF SUMMARY OF THE INVENTION

In accordance with the present invention, there is provided a semiconductor package (e.g., a QFP package) including a uniquely configured leadframe sized and configured to maximize the available number of exposed leads in the semiconductor package. More particularly, the semiconductor package of the present invention includes a generally planar die pad or die paddle defining multiple peripheral edge segments. In addition, the semiconductor package includes a plurality of leads. Some of these leads include exposed bottom surface portions or lands which are provided in at least one row or ring which at least partially circumvents the die pad, with other leads including portions which protrude from respective side surfaces of a package body of the semiconductor package. Connected to the top surface of the die pad is at least one semiconductor die which is electrically connected to at least some of the leads. At least portions of the die pad, the leads, and the semiconductor die are encapsulated by the package body, with at least portions of the bottom surfaces of the die pad and some of the leads being exposed in a common exterior surface of the package body. The leadframe of the semiconductor package is fabricated in accordance with standard, low-cost forming techniques. In accordance with the present invention, sawing, punching, etching, or other material removal processes may be completed during the fabrication of the semiconductor package to effectively electrically isolate various leads from each other within the semiconductor package. The semiconductor package of the present invention may include one or more internal semiconductor dies, depending on functional requirements.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
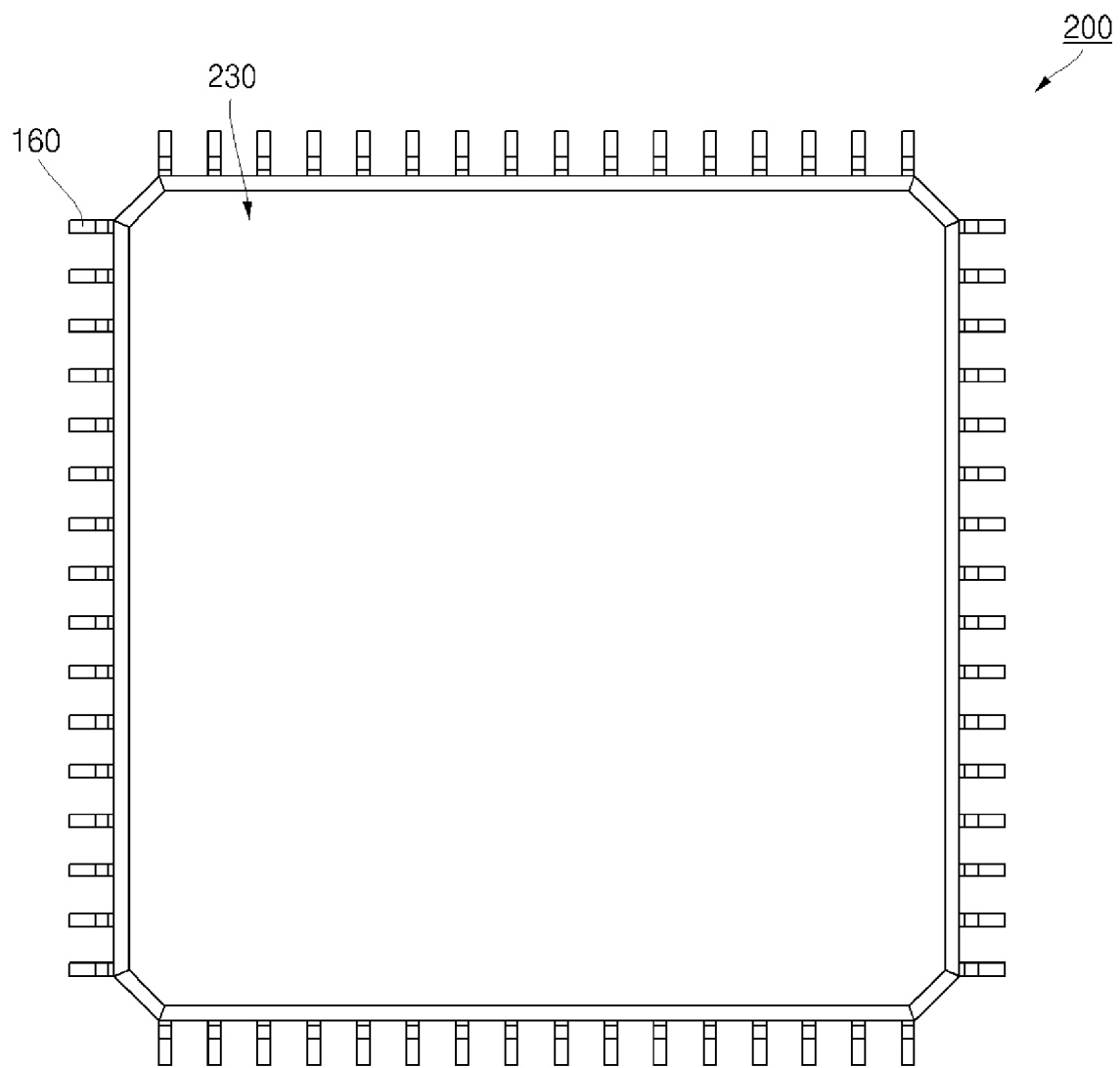
FIG. 1A is a top plan view of a semiconductor package constructed in accordance with a first embodiment of the present invention.
Figure 1B:
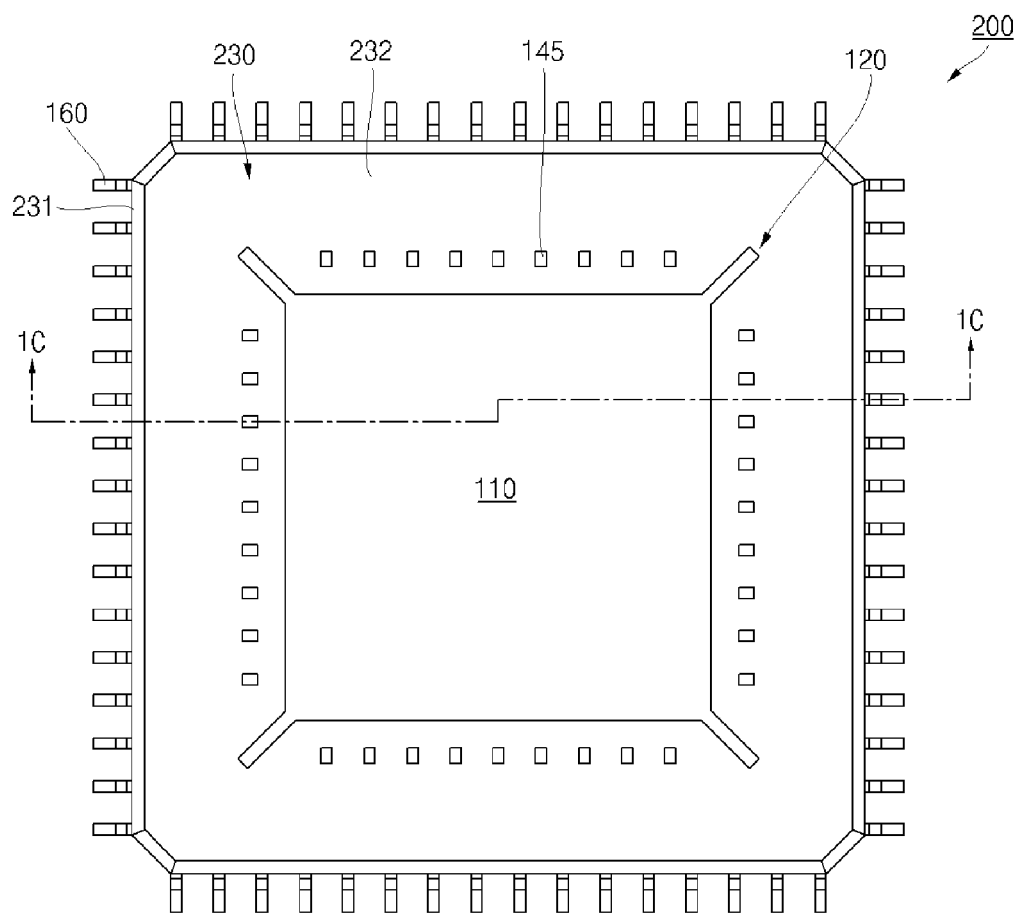
FIG. 1B is a bottom plan view of the semiconductor package shown in FIG. 1A.
Figure 1C:
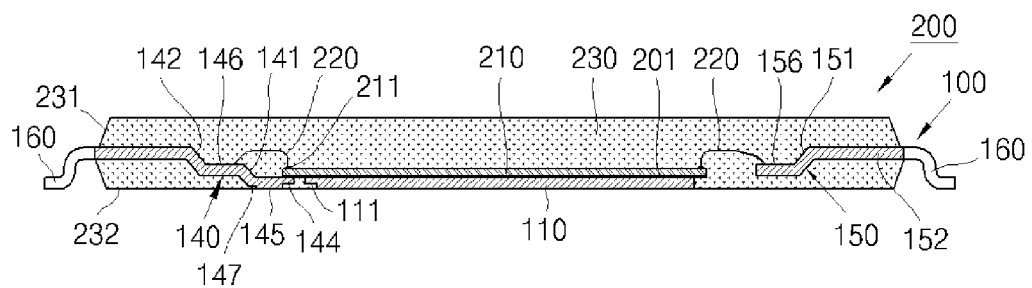
FIG. 1C is a cross-sectional view taken along line 1C-1C of FIG. 1B.

Referring now to the drawings wherein the showings are for purposes of illustrating one embodiment of the present invention only, and not for purposes of limiting the same, FIGS. 1A-1C depict a semiconductor package 200 constructed in accordance with a first embodiment of the present invention. The leadframe 100 integrated into the semiconductor package 200 is shown in its unsingulated state in FIG. 1D.

Figure 1D:
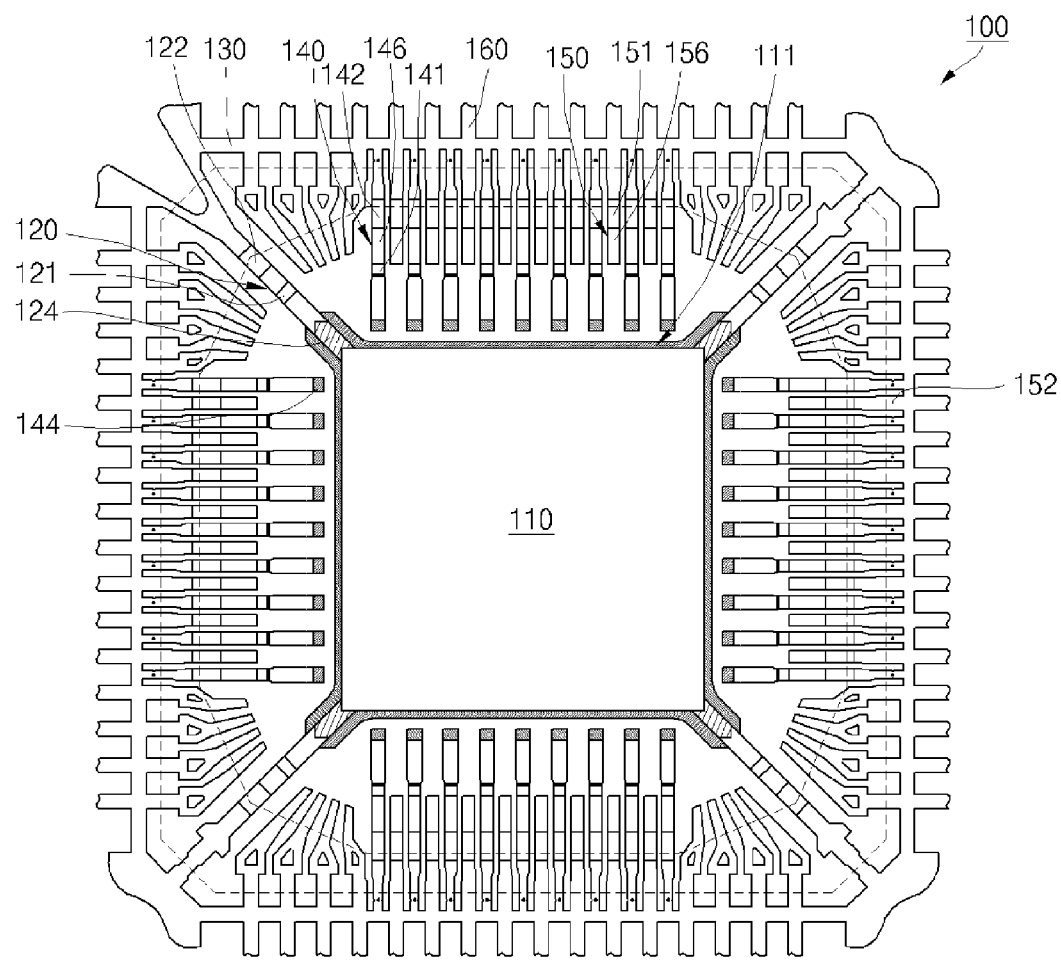
FIG. 1D is a top plan view of an unsingulated leadframe which is integrated into the semiconductor package shown in FIGS. 1A-1C.

Referring now to FIGS. 1A-1D, the leadframe 100 comprises a generally quadrangular (e.g., square) die pad 110 which defines four peripheral edge segments. As best seen in FIGS. 1C and 1D, the die pad 110 of the leadframe 100 is not of uniform thickness. Rather, formed in a peripheral portion of the bottom surface of the die pad 110 is a half-etched portion 111. More particularly, the half-etched portion 111 is segregated into four segments, with each of these segments extending along a respective one of peripheral edge segments of the die pad 110 and between a respective pair of tie bars 120 of the leadframe 100 which are described in more detail below. Though FIG. 1D is a top perspective view of the leadframe 100, the half-etched portion 111 in the bottom surface of the die pad 110 is indicated by the condensed hatching shown in FIG. 1D. As will be discussed in more detail below, in the fabrication process for the semiconductor package 200 including the leadfame 100, a semiconductor die is attached to the top surface of the die pad 110 through the use of an adhesive layer, with an encapsulant material thereafter being applied to the semiconductor die and the leadframe 100 to form the package body of the semiconductor package 200. Advantageously, the half-etched portion 111 formed in the peripheral portion of the bottom surface of the die pad 110 as indicated above effectively increases the distance along which moisture must travel to reach the semiconductor die mounted to the top surface of the die pad 110. As a result, such semiconductor die is safely protected against moisture in the completed semiconductor package 200. Additionally, the flow of encapsulant material over the half-etched portion 111 during the formation of the package body of the semiconductor package 200 facilitates the creation of a mechanical interlock between the package body and the die pad 110.

Integrally connected to the die pad 110 are a plurality of tie bars 120. More particularly, the leadframe 100 includes four tie bars 120 which extend diagonally from respective ones of the four corner regions defined by the die pad 110. As seen in FIG. 1D, the tie bars 120 are integrally connected to a generally quadrangular dambar 130 which circumvents the die pad 110 and is disposed in spaced relation thereto. Additionally, each of the tie bars 120 is bent to include a first downset 121 and a second downset 122. The first downset 121 of each tie bar 120 is disposed between the second downset 122 and the die pad 110. Due to the inclusion of the first and second downsets 121, 122 therein, each of the tie bars 120 includes a first segment which is disposed between the die pad 110 and the first downset 131 and extends in generally co-planar relation to the die pad 110, a second segment which extends between the first and second downsets 121, 122 and resides on a plane which is elevated above that of the die pad 110, and a third segment which extends between the second downset 122 and the dambar 130 and resides on a plane which is elevated above that of the second segment. Thus, the first, second and third segments of each tie bar 120 reside on respective ones of three spaced, generally parallel planes, with the plane upon which the second segment resides being disposed between those planes on which respective ones of the first and third segments reside. Along these lines, the die pad 110 resides on the first plane, with the dambar 130 residing on the third plane.

As further seen in FIG. 1D, the third segment of each of the tie bars 120 may be provided with a first opposed pair of integral locking protrusions to assist in the mechanical interlock of the tie bars 120 to the package body of the semiconductor package 200. Additionally, each of the tie bars 120 may include a second opposed pair of locking protrusions which are integrally connected to the die pad 110. Each of the locking protrusions of the second pair may be half etched, with the etched surface defining the bottom surface thereof. During the fabrication process for the semiconductor package 200 including the leadframe 100, the encapsulant material used to form the package body of the semiconductor package 200 is also able to flow over the etched bottom surfaces of the locking protrusions of the second pair, as well as the third segments including the locking protrusions of the first pair thereon, thus resulting in portions of the tie bars 120 being encapsulated by the package body of the semiconductor package 200 which improves the bonding or mechanical interlock therebetween. The etched surfaces of the locking protrusions of the second pair are also indicated by the hatching shown in FIG. 1D, such etched bottom surfaces extending in generally co-planar relation to the half-etched portion 111 of the die pad 110. As will also be discussed in more detail below, in the fabrication process for the semiconductor package 200 including the leadfame 100, the semiconductor die overlaps an inner end portion 124 of the top surface of each tie bar 120, such inner end portion being shown by the less condensed hatching included in FIG. 1D. In addition to overlapping the inner end portion 124 of each tie bar 120, the semiconductor die also overlaps portions of the top surfaces of each of the locking protrusions of the second pair of each tie bar 120.

As indicated above, the tie bars 120 are integrally connected to the dambar 130 which circumvents the die pad 110. In the leadframe 100, the dambar 130 is provided in the form of a substantially quadrangular (e.g., square) ring which interconnects the distal ends of the tie bars 120, thus resulting in the dambar 130 extending in generally co-planar relation to the third segments of the tie bars 120. More particularly, as best seen in FIG. 1D, the dambar 130 defines four peripheral segments which extend in spaced, generally parallel relation to respective ones of the peripheral edge segments of the die pad 110. In a fabrication process for the semiconductor package 200 which will be described in more detail below, the dambar 130 is singulated or removed from the leadframe 100 to electrically isolate other structural features of the leadframe 100 from each other.

The leadframe 100 of the semiconductor package 200 further comprises a plurality of first leads 140 which are integrally connected to the dambar 130 and extend inwardly toward the die pad 110. More particularly, the first leads 140 are segregated into four sets, with the first leads 140 of each set being integrally connected to an extending generally perpendicularly from a respective one of the four peripheral segments defined by the dambar 130. The first leads 140 of each set are also arranged at a predetermined pitch and are each of a predetermined length. As is apparent from FIG. 1D, the first leads 140 are not in electrical contact with the die pad 110. Rather, the distal end of each of the first leads 140 is positioned in spaced relation to the die pad 110.

As seen in FIGS. 1C and 1D, each of the first leads 140 is bent to include a first downset 141 and a second downset 142. The first downset 141 of each first lead 140 is disposed between the second downset 142 and the die pad 110. Due to the inclusion of the first and second downsets 141, 142 therein, each of the first leads 140 includes a first segment which is disposed between the die pad 110 and the first downset 141 and extends in generally co-planar relation to the die pad 110, a second segment which extends between the first and second downsets 141, 142 and resides on a plane which is elevated above that of the die pad 110, and a third segment which extends between the second downset 142 and the dambar 130 and resides on a plane which is elevated above that of the second segment. Thus, the first, second and third segments of each first lead 140 reside on respective ones of three spaced, generally parallel planes, with the plane upon which the second segment resides being disposed between those planes on which respective ones of the first and third segments reside. As indicated above, the die pad 110 and the first segments of the tie bars 120 reside on the first plane, with the second segments of the tie bars 120 residing on the second plane, and the dambar 130 and the third segments of the tie bars 120 residing on the third plane.

As will also be discussed in more detail below, in the fabrication process for the semiconductor package 200 including the leadfame 100, the semiconductor die overlaps an inner end portion of the top surface of the first segment of each first lead 140. As best seen in FIGS. 1C and 1D, formed in the bottom surface of the first segment of each first lead 140 is a half-etched portion 144 which is disposed in opposed relation to the inner end portion defined by the top surface thereof. Thus, the half-etched portion 144 of each first lead 140 defines the bottom surface of the inner end portion thereof. Though FIG. 1D is a top plan view of the leadframe 100, the half-etched portion 144 of each first lead 140 is indicated by the condensed hatching shown in FIG. 1D. The half-etched portion 144 extends to the inner, distal end of the first lead 150 defined by the first segment thereof. As a result of the formation of the half-etched portion 144 within the bottom surface of the first segment of each of the first leads 140, the non-etched portion of the bottom surface of the first segment of each first lead 140 extending to the first downset 141 defines a generally planar land 145. As is most apparent from FIG. 1C, the land 145 defined by each first lead 140 extends in generally co-planar relation to the generally planar bottom surface of the die pad 110 which is circumvented by the half-etched portion 111. Along these lines, the generally planar top surface of the first segment of each first lead 140 extends in generally co-planar relation to the generally planar top surface of the die pad 110. Further, as is also apparent from FIG. 1C, the half-etched portion 144 of the first segment of each first lead 140 may extend in generally co-planar relation to the half-etched portion 111 of the die pad 110.

In the leadframe 100 of the present invention, it is contemplated that the half-etched portion 144 of each of the first leads 140 can be formed by either half-etching as described above, or alternatively by forging. During the fabrication process for the semiconductor package 200 including the leadframe 100, the encapsulant material used to form the package body of the semiconductor package 200 is able to flow over the half-etched portion 144, thus facilitating a strong mechanical bond or interlock between each of the first leads 140 and the package body despite the land 145 defined by each first lead 140 being exposed in such package body. The half-etched portion 144 of each first lead 140 also serves to prevent insufficient filling or complete separation of the package body in the vicinity of the lands 145, and further serves to fix the first leads 140 within the package body such that the lands 145 do not protrude from the bottom surface of the package body, but rather are substantially flush or continuous therewith as will be described in more detail below.

As best seen in FIG. 1C, each of the first leads 140 may further include a notch cut 147 disposed in the bottom surface at that end of the land 145 opposite that extending to the half-etched portion 144. Specifically, the notch cut 147 is formed at the bent portion of the first lead 140 where the first downset 141 and the land 145 meet. The notch cuts 147 prevent the occurrence of rolling over at the bent portions during formation of the first downsets 141. As a result, the package body of the semiconductor package 200 including the leadframe 100 is protected from being broken at the bent portions, and the lands 145 are protected from being irregularly deformed, thus enabling stable mounting of the semiconductor package on an underlying structure such as a printed circuit board (PCB).

In addition to defining the land 145, each of the first leads 140 further includes a wire bonding area 146 defined by the top surface of the second segment thereof which, as indicated above, extends between the first and second downsets 141, 142. Thus, as will be recognized, the wire bonding area 146 is situated at a higher level than the die pad 110. As will be discussed in more detail below, the wire bonding area 146 of each of the first leads 140 provides an area for the electrical bonding of conductive wires.

The leadframe 100 constructed in accordance with the present invention further comprises a plurality of second leads 150 which are integrally connected to the dambar 130. More particularly, the second leads 150, like the first leads 140, are preferably segregated into four sets, with each set of the second leads 150 extending between an adjacent pair of the tie bars 120. The second leads 150 of each set also extend generally perpendicularly relative to a respective one of the peripheral segments of the dambar 130 at a predetermined length, the second leads 150 of each set also being arranged at a predetermined pitch. Each of the second leads 150 includes an inner portion 152 which extends extend inwardly from the dambar 130 toward the die pad 110 in spaced relation thereto. In addition to the inner portion 152, each of the second leads 150 includes an outer portion 160 which extends extend outwardly from the dambar 130 away from the die pad 110. The outer portions 160 are preferably linearly aligned with respective ones of the inner portions 152. As is apparent from FIG. 1D, the inner portions 152 are shorter in length than the first leads 140. Additionally, certain ones of the inner portions 152 of each set of the second leads 150 have a generally linear configuration, and extend between a respective, adjacent pair of the first leads 140 in spaced relation thereto. Those inner portions 152 of each set of the second leads 150 which do not extend between an adjacent pair of the first leads 140 each preferably have an angled configuration so as to be disposed closer to a respective one of the peripheral edge segments of the die pad 110.

In the leadframe 100, each of the inner portions 152 which has a generally straight or linear configuration and extends between an adjacent pair of the first leads 140 is preferably bent to include a downset 151. Due to the inclusion of the downset 151 therein, each of the inner portions 152 includes a first segment which is disposed between the downset 151 and the die pad 110, and a second segment which extends between the downset 151 and the dambar 130. The first segments of the inner portions 152 preferably reside on the same plane as the second segments of the first leads 140. Similarly, the second segments of the inner portions 152 preferably reside on the same plane as the third segments of the first leads 140 and the dambar 130. In this regard, each of the inner portions 152 includes a wire bonding area 156 which is defined by the top surface of the first segment thereof and extends from the downset 151 to the distal end of the inner portion 152 defined by the first segment. The wire bonding areas 156 of the inner portions 152 extend in generally co-planar relation to the wire bonding areas 146 of the first leads 140. Like the wire bonding areas 146 of the first leads 140, the wire bonding areas 156 of the inner portions 152 of the second leads 150 provide areas for the electrical bonding of conductive wires, as will be described in more detail below. In the leadframe 100, it is contemplated that for ease of wire bonding, gold or silver may be plated on the wire bonding areas 146, 156. Alternatively, the leadframe 100 may a pre-plated leadframe (PPF) to provide enhanced wire bonding areas.

In the leadframe 100, the outer portions 160 of the second leads 150, the dambar 130, the second segments of the inner portions 152 of the second leads 150, and the third segments of the first leads 140 all reside on a common plane. In the process of fabricating the semiconductor package 200 as will be described in more detail below, the dambar 130 is ultimately singulated in a manner wherein each outer portion 160 remains integrally connected to a respective one of the inner portions 152, with each connected pair of the inner and outer portions 152, 160 (and thus each second lead 150) being electrically isolated from every other second lead 150. The singulation of the dambar 130 also occurs in a manner wherein the first leads 140 are electrically isolated from each other, and from each second lead 150.

The leadframe 100 of the semiconductor package 200 may be fabricated from a conventional metal material, such as copper, copper alloy, steel plated with copper, or a functional equivalent. However, those of ordinary skill in the art will recognize that the present invention is not limited to any particular material for the leadframe 100. Additionally, the number of first and second leads 140, 150 shown in FIG. 1D is for illustrative purposes only, and may be modified according to application field. Along these lines, the first and second leads 140, 150 may have designs or configurations varying from those shown in FIG. 1D without departing from the spirit and scope of the present invention. Additionally, though the first and second leads 140, 150 are each shown as each being segregated into four sets, it will be recognized that fewer sets of the first and second leads 140, 150 may be provided, and may be arranged along any combination of two or three of the peripheral sides of the die pad 110. Moreover, less than four tie bars 120 may be included in the leadframe 100, extending to respective corners of the die pad 110 in any combination. It is further contemplated that the leadframe 100 may be fabricated through the implementation of a chemical etching process or alternatively a mechanical stamping process.

Referring now to FIGS. 1A-1C, the semiconductor package 200 as fabricated to include the leadframe 100 is shown in detail. As will be recognized by those of ordinary skill in the art, in the completed semiconductor package shown in FIGS. 1A-1C, the dambar 130 is singulated or removed from the leadframe 100 to facilitate the electrical isolation of the various structural features of the leadframe 100 from each other. More particularly, the dambar 130 is singulated in a manner wherein each outer portion 160 remains integrally connected to a respective one of the inner portions 152, and the second leads 150 are electrically isolated from each other. The singulation of the dambar 130 also occurs in a manner wherein the first leads 140 are electrically isolated from each other, and from each of the second leads 150.

In the semiconductor package 200, a semiconductor die 210 is attached to and covers the generally planar top surface of the die pad 110, the generally planar inner end portions of the top surfaces of the first segments of the first leads 140, and the inner end portions 124 of the top surfaces of the tie bars 120. Such attachment is preferably facilitated through the use of and of an adhesive layer 201. The semiconductor die 210 directly pushes down on and equally supports the die pad 110, the inner end portions of the first leads 140, and the inner end portions 124 of the tie bars 120. Thus, the exposed lands 145 of the first leads 140 are effectively stabilized, which ensures their consistent shape and orientation with the semiconductor package 200. In other words, the semiconductor die 210 ensures the flatness or co-planarity of the lands 145. If the lands 145 are not co-planar, a large amount of flash (a portion of the encapsulant used to form the package body of the semiconductor package 200) may occur on the lands 145 during the fabrication of the semiconductor package 200. The adhesive layer 201 is preferably a film type adhesive with low moisture absorption that is advantageous in preventing the semiconductor die 210, the die pad 110, the inner end portions of the first leads 140 and the inner end portions 124 of the tie bars 120 from being separated from the adhesive layer 201. If the adhesive layer 201 had high moisture absorption, it could create the danger that its volume may be excessively large during reflow in the fabrication of the semiconductor package 200, thus requiring that the elements in contact with the adhesive layer 201 be highly durable, leading to the separation of the elements from the adhesive layer 201. The semiconductor die 210 includes a plurality of bond pads 211 which are disposed on the top surface thereof opposite the bottom surface adhered to the adhesive layer 201. The bond pads 211 are used to deliver and receive electrical signals.

The semiconductor package 200 further comprises a plurality of conductive wires 220 which are used to electrically connect the bond pads 211 of the semiconductor die 210 to respective ones of the first leads 140 and the inner portions 152 of the second leads 150. The conductive wires 220 may be fabricated from aluminum, copper, gold, silver, or a functional equivalent. However, those of ordinary skill in the art will recognize that the present invention is not limited to any particular material for the wires 220. In the semiconductor package 200, in electrically connecting the bond pads 211 to the first leads 140, it is contemplated that the conductive wires 220 will be extended from the bond pads 211 to the wire bonding areas 146 defined by the second segments of respective ones of the first leads 140. However, the electrical connection of the bond pads 211 of the semiconductor die 210 to the first leads 140 may also be facilitated by extending the conductive wires 220 between the bond pads 211 and the top surfaces of the first segments of respective ones of the first leads 140. The electrical connection of the bond pads 211 of the semiconductor die 210 to the second leads 150 is preferably facilitated by extending the conductive wires 220 from the bond pads 211 to the wire bonding areas 156 defined by the first segments of respective ones of the inner portions 152. Since the wire bonding areas 146 of the first leads 140 extend in generally co-planar relation to the wire bonding areas 156 of the inner portions 152 of the second leads 150, the conductive wires 220 can be bonded to the wire bonding areas 146, 156 by repeatedly reciprocating capillaries at the same height to maintain constant wiring bonding quality.

In the semiconductor package 200, the die pad 110, the tie bars 120, the first leads 140, the inner portions 152 of the second leads 150, the semiconductor die 210 and the conductive wires 220 are at least partially encapsulated or covered by an encapsulant material which, upon hardening, forms the package body 230 of the semiconductor package 200. More particularly, the package body 230 covers the entirety of the die pad 210 except for the bottom surface thereof which is circumvented by the half-etched portion 111. The package body 230 also covers the entirety of each of the first leads 140 except for the land 145 defined thereby and a small portion of the third segment thereof. The package body 230 also covers the entirety of each of the inner portions 152 of the second leads 150 except for a small portion of the second segment thereof. The entirety of each of the tie bars 120 is also covered by the package body 230, except for the bottom surface of the first segment of each tie bar 120 which extends in generally co-planar relation to the bottom surface of the die pad 110 and the lands 145 defined by the extension leads 140. The outer portions 160 of the second leads 150 of the leadframe 100 are not covered by the package body 230. The dambar 130 is also not covered by the package body 230 so that it may be removed from the leadframe 100.

Due to the structural attributes of the fully formed package body 230, the generally planar bottom surface of the die pad 110 is exposed in and substantially flush with the generally planar bottom surface 232 of the package body 230, as are the generally planar bottom surfaces of the first segments of the tie bars 120. Similarly, the generally planar land 145 defined by each first lead 140 is exposed in and substantially flush with the bottom surface 232 of the package body 230. The outer portions 160 of the second leads 150 of each set thereof protrude laterally outward from respective side surfaces 231 of the package body 230. As seen in FIGS. 1A-1C, the exposed outer portions 160 may be bent to assume a gull-wing configuration to allow the same to be electrically connected to an underlying substrate such as a printed circuit board. As indicated above, in order to complete the fabrication of the semiconductor package 200 to allow the same to assume the configuration shown in FIGS. 1A-1C, the dambar 130 must be removed from the leadframe 100 to facilitate the electrical isolation of the first leads 140 and the second leads 150 from each other as explained above. In this regard, it is contemplated that a conventionally known debarring process may be implemented to remove the dambar 130. The completion of such debarring process results in each of the first leads 140 defining an outer, distal end which is exposed in and substantially flush with a respective side surface 231 defined by the package body 230.

In the semiconductor package 200, the wire bonding areas 146, 156 to which the conductive wires 220 are extended can prevent sweeping and shorting of the conductive wires 220 arising from the flow of the encapsulant material during the process of forming the package body 230. As indicated above, in the semiconductor package 200, the semiconductor die 210 directly pushes down on and equally supports the die pad 110, the inner end portions of the first leads 140, and the inner end portions 124 of the tie bars 120. Thus, the exposed lands 145 of the first leads 140 are effectively stabilized, which ensures their consistent shape and orientation with the semiconductor package 200. With the configuration of the leadframe 100 described above, a total of about sixty-four (sixteen per side) second leads 150 and a total of about thirty-six (nine per side) lands 145 are included in the lead frame 100 of the semiconductor package 200. That is, the semiconductor package 200 further has thirty-six I/O pins through the lands 145. As indicated above, the particular number of I/O pins described above is not intended to limit the present invention.

As also indicated above, the outer portions 160 of the second leads 150 are exposed in the semiconductor package 200, as are the lands 145 defined by the first leads 140. As a result, the lands 145 are capable of being mounted to the surface of an underlying substrate such as a printed circuit board through the use of, for example, a soldering technique. Electrical signals are routed between the lands 145 and the semiconductor die 210 by the corresponding first leads 140 and conductive wires 220. Similarly, electrical signals may be routed from the semiconductor die 210 to the outer portions 160 by the corresponding integrally connected inner portions 152 and conductive wires 220. Like the lands 145, the outer portions 160 may be surface mounted to an underlying substrate such as a printed circuit board through the use of, for example, a soldering technique. Since the leadframe 100 of the semiconductor package 200 is configured to provide the outer portions 160 which protrude from the side surfaces 231 of the package body 230 and the lands 145 which are exposed in the bottom surface 232 of the package body 230, the number of I/O's in the leadframe 100 increases in proportion to the number of the outer portions 160 (i.e., second leads 150) and the lands 145.

Figure 2:
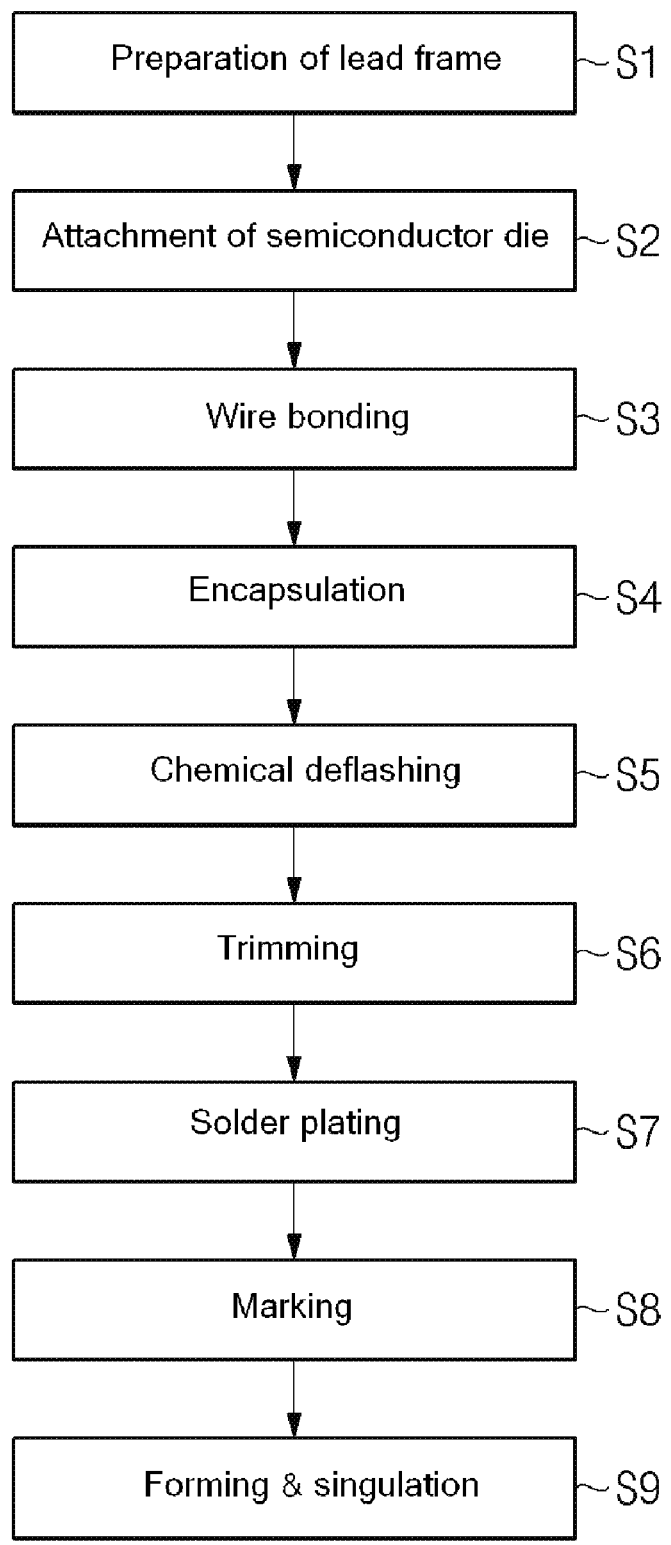
FIG. 2 is a flow chart illustrating an exemplary fabrication method for the semiconductor package shown in FIGS. 1A-1C.

Referring now to FIG. 2, there is provided a flow chart which sets forth an exemplary method for fabricating the semiconductor package 200 of the present invention. The method comprises the steps of preparing the leadframe (S1), semiconductor die attachment (S2), wire bonding (S3), encapsulation (S4), chemical deflashing (S5), trimming (S6), solder plating (S7), marking (S8), and forming and singulation (S9). FIGS. 3A-3I provide illustrations corresponding to these particular steps, as will be discussed in more detail below.

Figure 3A:
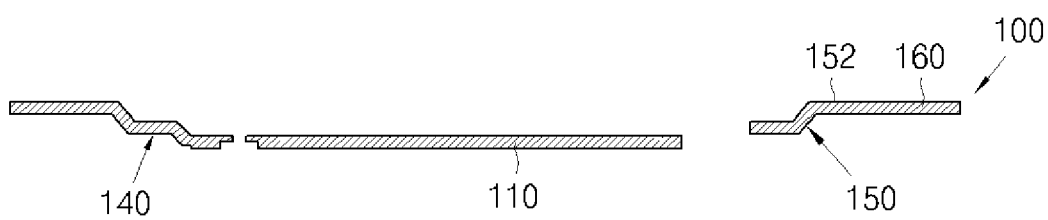
FIGS. 3A-3I are views illustrating an exemplary fabrication method for the semiconductor package shown in FIGS. 1A-1C.
Figure 3B:
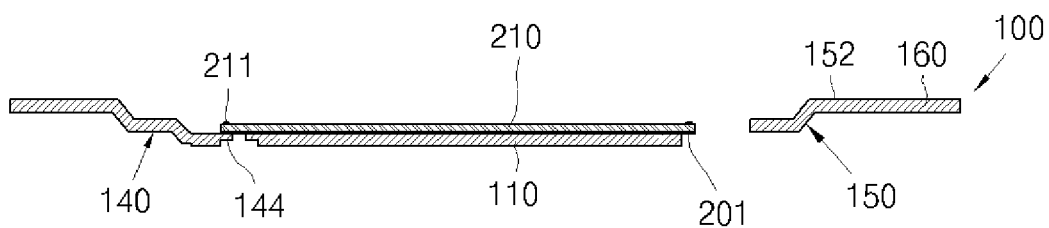

Referring now to FIG. 3A, in the initial step S1 of the fabrication process for the semiconductor package 200, the leadframe 100 having the above-described structural attributes is provided. Thereafter, as illustrated in FIG. 3B, step S2 is completed wherein the semiconductor die 210 having the bond pads 211 is attached to and covers the generally planar top surface of the die pad 110, the generally planar inner end portions of the top surfaces of the first segments of the first leads 140, and the inner end portions 124 of the top surfaces of the tie bars 120 through the use of the adhesive layer 201. As indicated above, the adhesive layer 201 can be selected from well known liquid epoxy adhesives, adhesive films and adhesive tapes, as well as equivalents thereto.

Figure 3C:
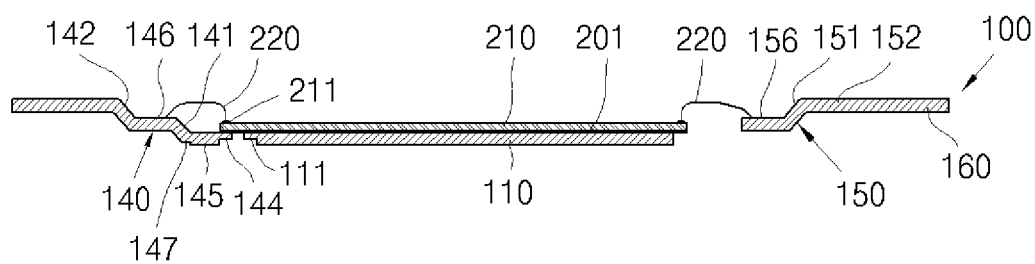
Figure 3D:
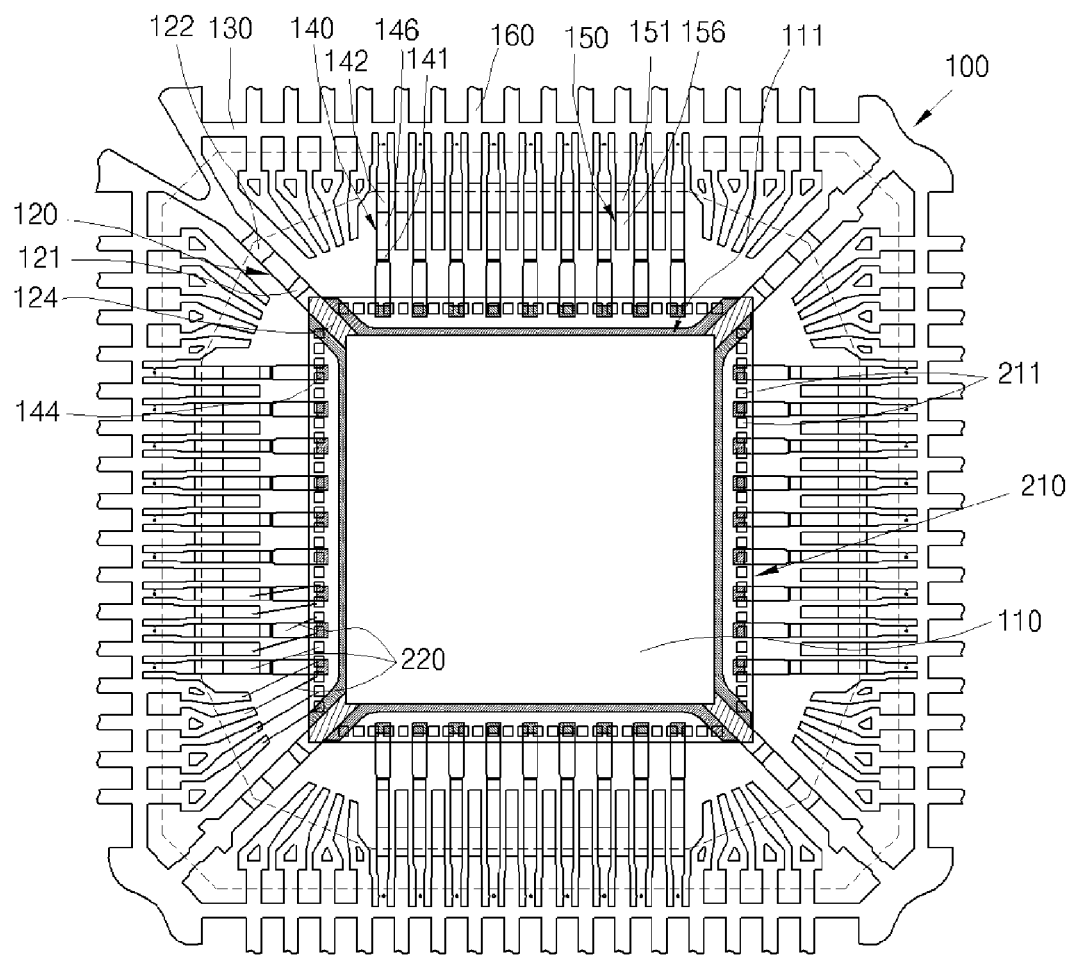

Referring now to FIGS. 3C and 3D, in the next step S3 of the fabrication process, the conductive wires 220 are used to electrically interconnect the semiconductor die 210 to the leadframe 100 in the aforementioned manner. Specifically, the bond pads 211 of the semiconductor die 210 are electrically connected to the first leads 140 and the second leads 150.

Figure 3E:
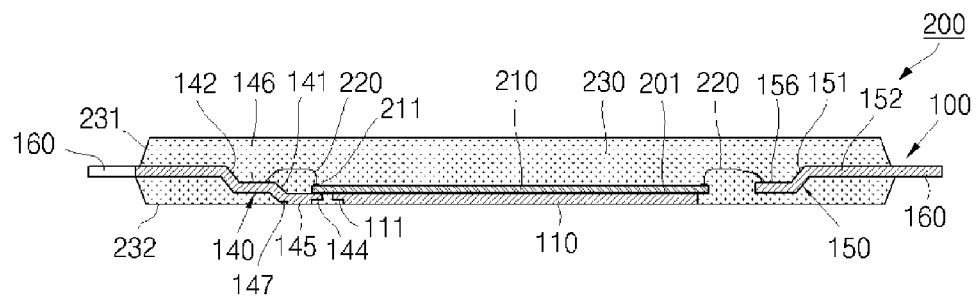
Figure 3F:
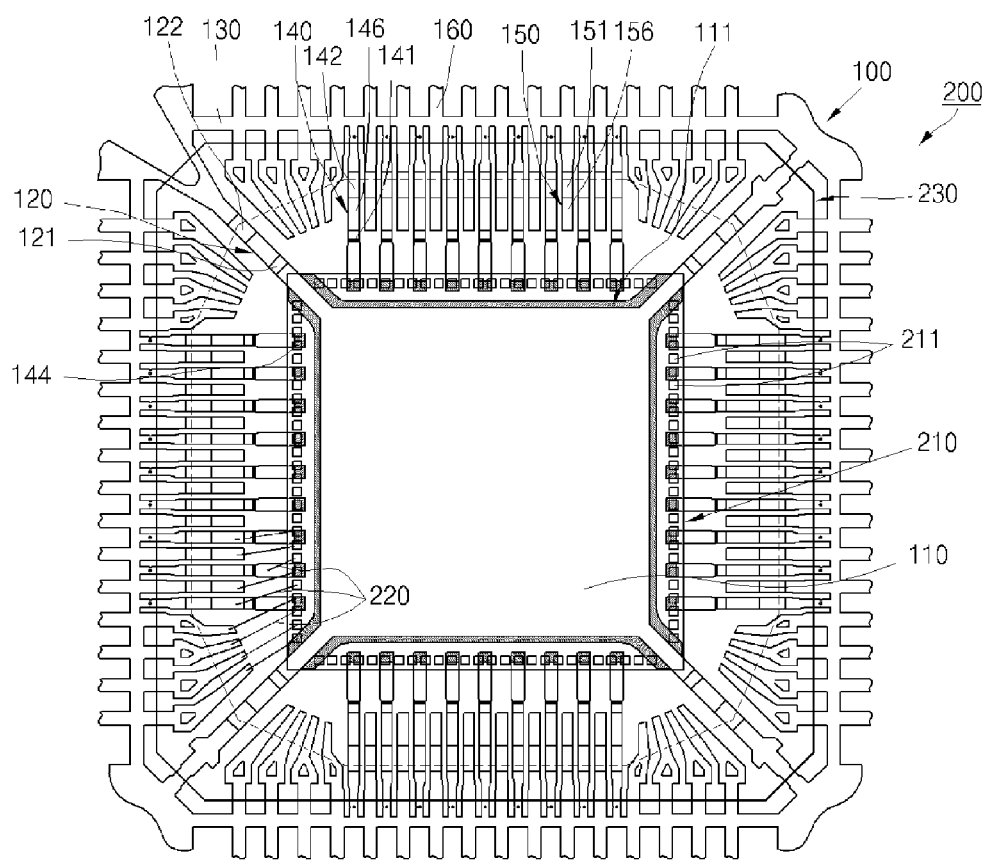

Referring now to FIGS. 3E and 3F, in the next step S4 of the fabrication process for the semiconductor package 200, portions of the leadframe 100, the semiconductor die 210 and the conductive wires 220 are encapsulated with an encapsulant material which, upon hardening, forms the package body 230 of the semiconductor package 200. More particularly, the package body 230 covers the entirety of the die pad 210 except for the bottom surface thereof which is circumvented by the half-etched portion 111. The package body 230 also covers the entirety of each of the first leads 140 except for the land 145 defined thereby and a small portion of the third segment thereof. The package body 230 also covers the entirety of each of the inner portions 152 of the second leads 150 except for a small portion of the second segment thereof. The entirety of each of the tie bars 120 is also covered by the package body 230, except for the bottom surface of the first segment of each tie bar 120 which extends in generally coplanar relation to the bottom surface of the die pad 110 and the lands 145 defined by the first leads 140. The outer portions 160 of the second leads 150 of the leadframe 100 are not covered by the package body 230. The dambar 130 is also not covered by the package body 230 so that it may be removed from the leadframe 100. Subsequent to the formation of the package body 230 in step S4, chemical deflashing (step S5) may be performed if films of flash (a resin component of the encapsulant material) are formed on the bottom surface of the die pad 110 and upon the lands 145. If such thin films of flash are present as could impede the ability to mount the semiconductor package 200 to an underlying substrate, the removal of such flash films by a chemical etching method is required.

Figure 3G:
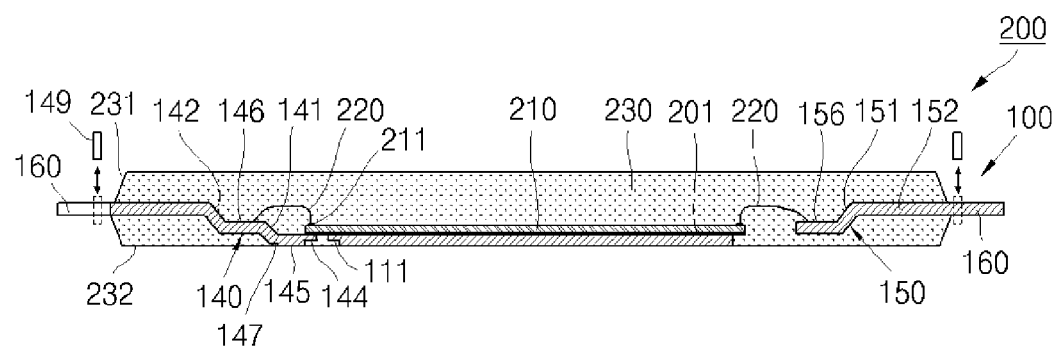
Figure 3H:
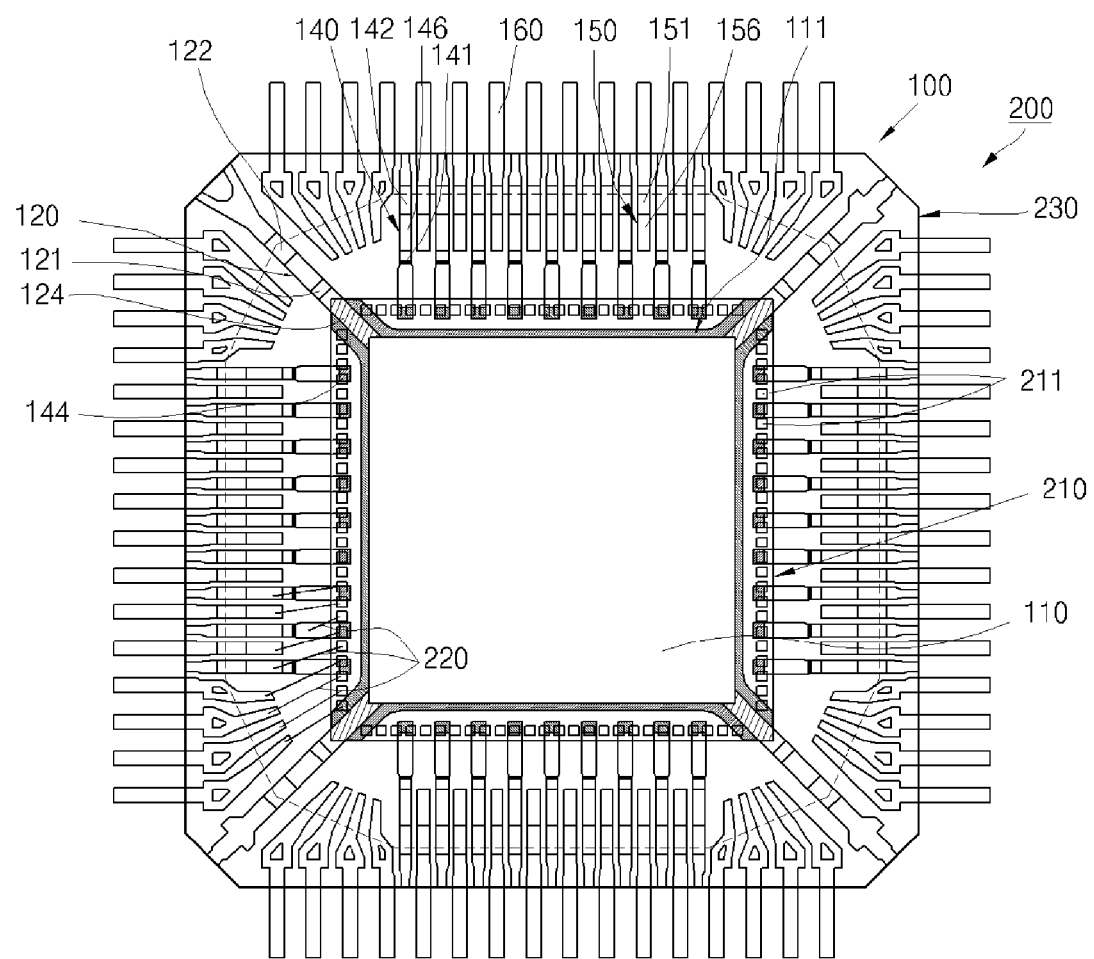

Referring now to FIGS. 3G and 3H, in the next step S6 of the fabrication process for the semiconductor package 200, the dambar 130 is trimmed or removed by cutting so that the first leads 140 and the second leads 150 are electrically isolated from each other in the above described manner. As previously explained, the dambar 130 is positioned outside of the package body 230 to allow for the removal thereof from the leadframe 100, and is removed by cutting the same with dambar cutting tools 149. In addition, as also previously described, portions of the first leads 140 protruding from the side surfaces 231 of the package body 230 are also completely removed during the trimming process.

Upon the completion of step S6, a solder plating step (step S7) may also be performed in the fabrication process for the semiconductor package 200. More particularly, after the dambar 130 and portions of the first leads 140 have been removed using the dambar cutting tools 149, some metal areas of the leadframe 100 susceptible to oxidation are exposed to air. Since the leadframe 100 is typically made of copper, the same is susceptible to oxidation. In order to prevent the oxidation of the exposed metal areas of the leadframe 100, all elements (e.g. the first leads 140) of the leadframe 100 exposed outside of the package body 230 may be plated by soldering. Subsequent to the completion of any such solder plating step (step S7), a marking step (step S8) may be performed upon the semiconductor package 200. More particularly, ink or a laser may be used to mark the product name, the manufacturer of the semiconductor package 200, etc. on a prescribed surface of the package body 230.

Figure 3I:
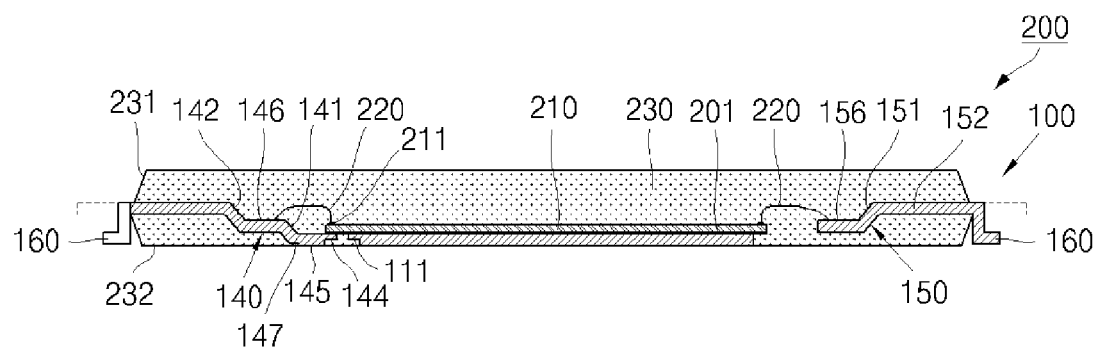

Referring now to FIG. 3I, in the next step S9 of the fabrication process for the semiconductor package 200, the outer portions 160 of the second leads 150 protruding from the package body 230 are formed in appropriate shapes. Specifically, the exposed outer portions 160 protruding from the side surfaces 231 of the package body 230 may be formed into predetermined shapes using a lead forming tool (not shown) to allow the semiconductor package 200 to have a shape suitable for mounting to an external unit or an underlying substrate. Although the outer portions 160 are depicted as being formed outwardly relative to the package body 230 in FIG. 3I, those of ordinary skill in the art will recognize that the outer portions 160 can alternatively be formed downwardly and inwardly relative to the package body 230. Thereafter, portions of the tie bars 120 protruding outwardly from the package body 230 are cut to separate the semiconductor package 200 from the leadframe 100.

Figure 4A:
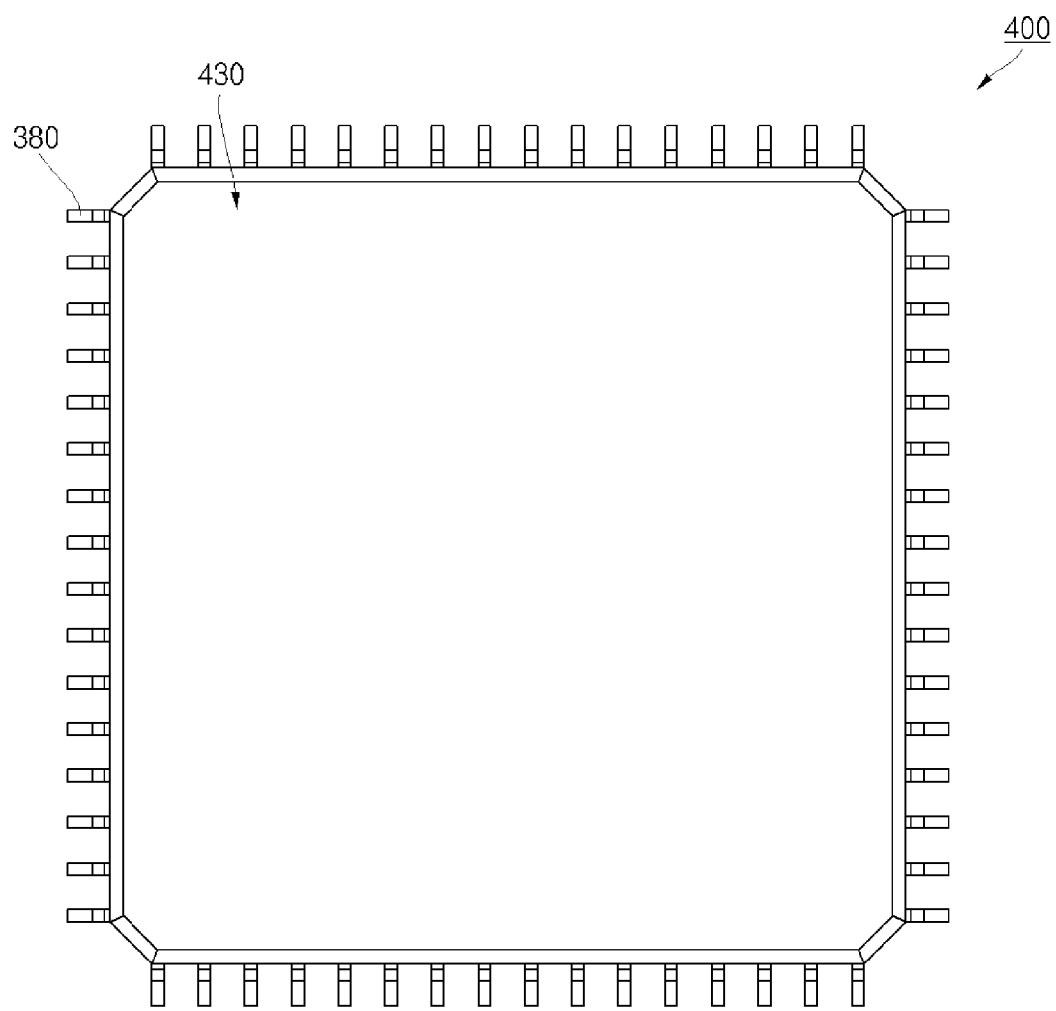
FIG. 4A is a top plan view of a semiconductor package constructed in accordance with a second embodiment of the present invention.
Figure 4B:
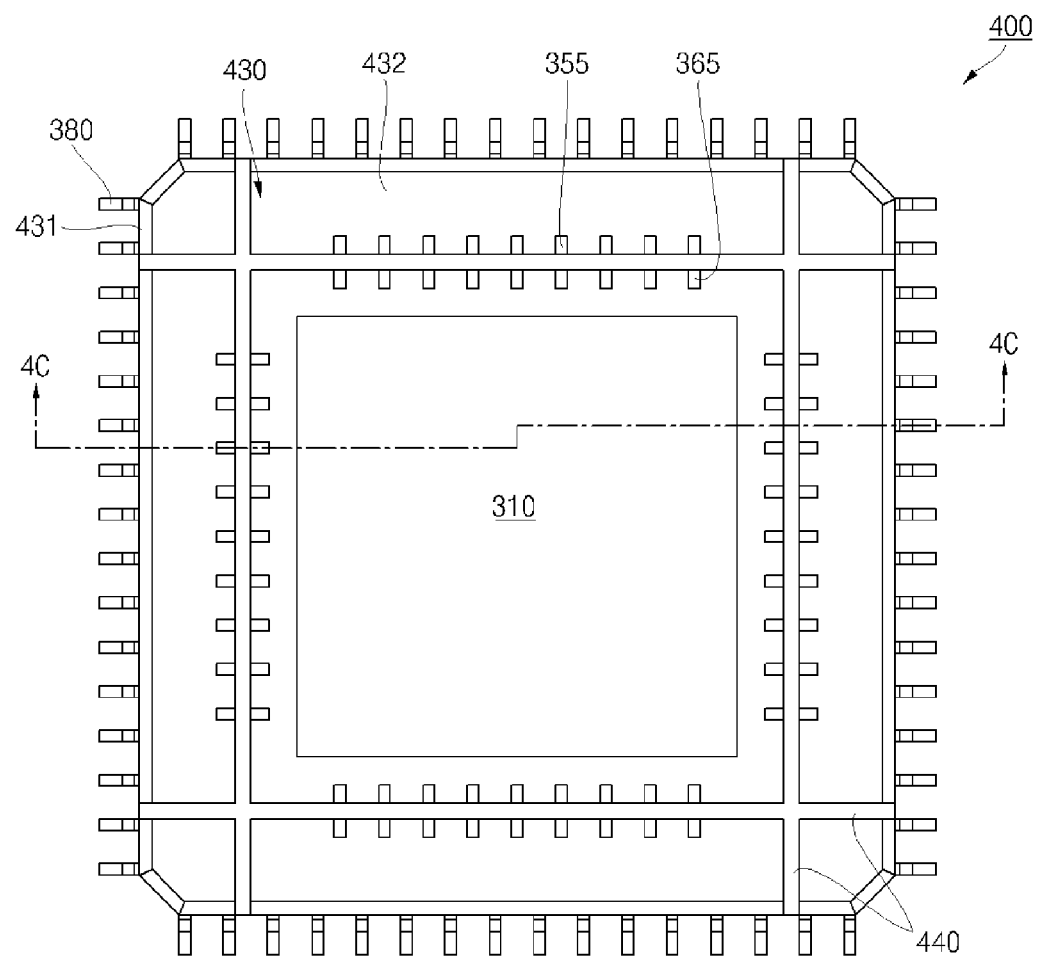
FIG. 4B is a bottom plan view of the semiconductor package shown in FIG. 4A.
Figure 4C:
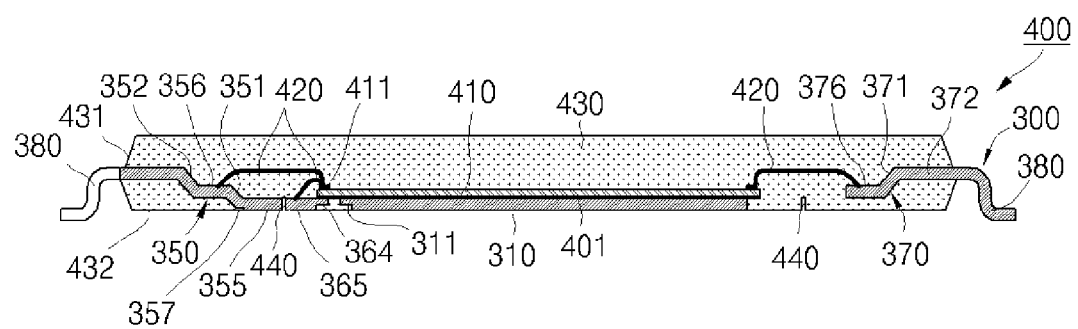
FIG. 4C is a cross-sectional view taken along line 4C-4C of FIG. 4B.

Referring now to FIGS. 4A-4C, there is shown a semiconductor package 400 constructed in accordance with a second embodiment of the present invention. The leadframe 300 integrated into the semiconductor package 400 is shown in its unsingulated state in FIG. 4D.

Figure 4D:
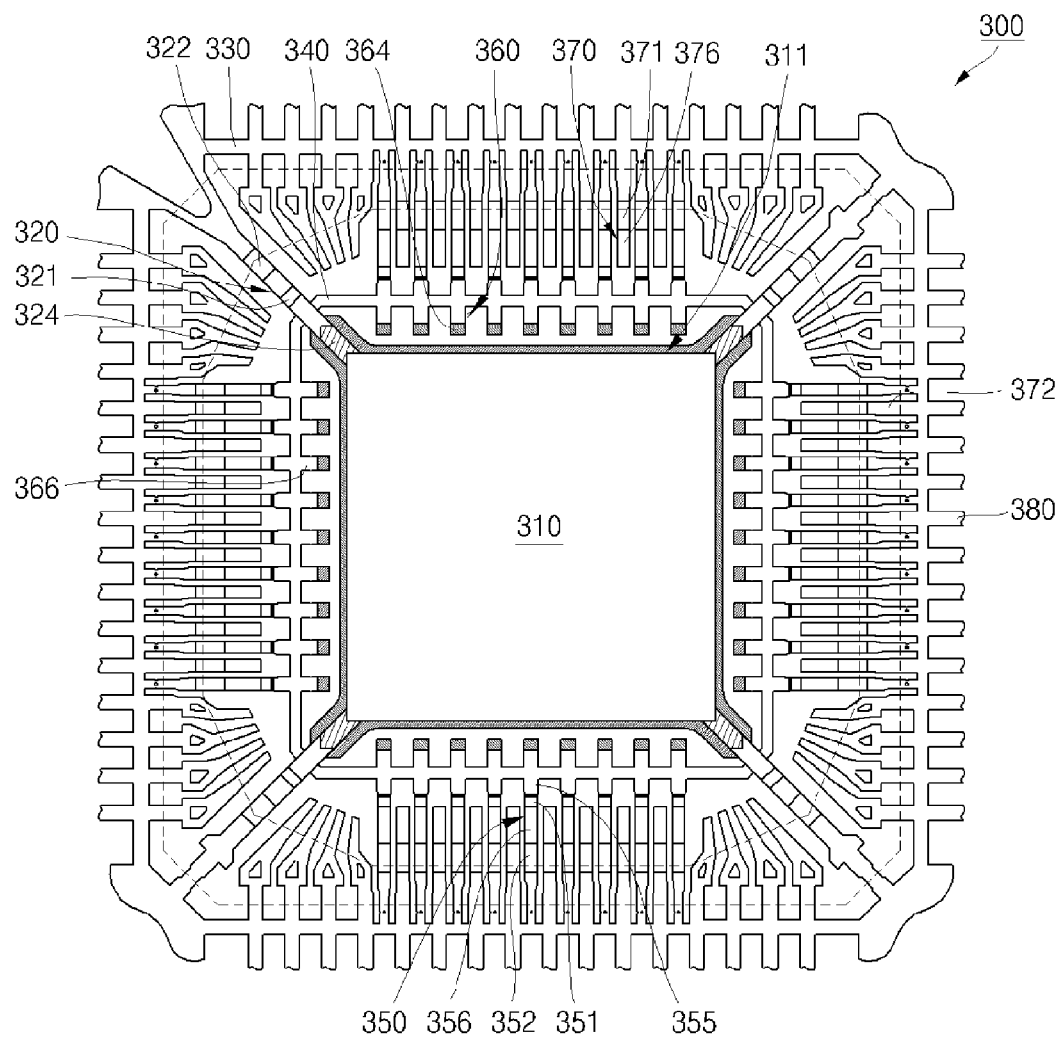
FIG. 4D is a top plan view of an unsingulated leadframe which is integrated into the semiconductor package shown in FIGS. 4A-4C.

Referring now to FIGS. 4A-4D, the leadframe 300 comprises a generally quadrangular (e.g., square) die pad 310 which defines four peripheral edge segments. As best seen in FIGS. 4C and 4D, the die pad 310 of the leadframe 300 is not of uniform thickness. Rather, formed in a peripheral portion of the bottom surface of the die pad 310 is a half-etched portion 311. More particularly, the half-etched portion 311 is segregated into four segments, with each of these segments extending along a respective one of peripheral edge segments of the die pad 310 and between a respective pair of tie bars 320 of the leadframe 300 which are described in more detail below. Though FIG. 4D is a top plan view of the leadframe 300, the half-etched portion 311 in the bottom surface of the die pad 310 is indicated by the condensed hatching shown in FIG. 4D. The half-etched portion 311 provides the same functionality described above in relation to the half-etched portion 111 of the die pad 110 included in the leadframe 100.

Integrally connected to the die pad 310 are a plurality of tie bars 320. More particularly, the leadframe 300 includes four tie bars 320 which extend diagonally from respective ones of the four corner regions defined by the die pad 310. As seen in FIG. 4D, the tie bars 320 are integrally connected to a generally quadrangular dambar 330 which circumvents the die pad 310 and is disposed in spaced relation thereto. Additionally, each of the tie bars 320 is bent to include a first downset 321 and a second downset 322. The first downset 321 of each tie bar 320 is disposed between the second downset 322 and the die pad 310. Due to the inclusion of the first and second downsets 321, 322 therein, each of the tie bars 320 includes a first segment which is disposed between the die pad 310 and the first downset 331 and extends in generally co-planar relation to the die pad 310, a second segment which extends between the first and second downsets 321, 322 and resides on a plane which is elevated above that of the die pad 310, and a third segment which extends between the second downset 322 and the dambar 330 and resides on a plane which is elevated above that of the second segment. Thus, the first, second and third segments of each tie bar 320 reside on respective ones of three spaced, generally parallel planes, with the plane upon which the second segment resides being disposed between those planes on which respective ones of the first and third segments reside. Along these lines, the die pad 310 resides on the first plane, with the dambar 330 residing on the third plane.

As further seen in FIG. 4D, the third segment of each of the tie bars 320 may be provided with a first opposed pair of integral locking protrusions to assist in the mechanical interlock of the tie bars 320 to the package body of the semiconductor package 400. Additionally, each of the tie bars 320 may include a second opposed pair of locking protrusions which are integrally connected to the die pad 310. Each of the locking protrusions of the second pair may be half etched, with the etched surface defining the bottom surface thereof. During the fabrication process for the semiconductor package 400 including the leadframe 300, the encapsulant material used to form the package body of the semiconductor package 400 is also able to flow over the etched bottom surfaces of the locking protrusions of the second pair, as well as the third segments including the locking protrusions of the first pair thereon, thus resulting in portions of the tie bars 320 being encapsulated by the package body of the semiconductor package 400 which improves the bonding or mechanical interlock therebetween. The etched surfaces of the locking protrusions of the second pair are also indicated by the hatching shown in FIG. 4D, such etched bottom surfaces extending in generally co-planar relation to the half-etched portion 311 of the die pad 310. In the semiconductor package 400 including the leadfame 300, the semiconductor die overlaps an inner end portion 324 of the top surface of each tie bar 320, such inner end portion being shown by the less condensed hatching included in FIG. 4D. In addition to overlapping the inner end portion 324 of each tie bar 320, the semiconductor die also overlaps portions of the top surfaces of each of the locking protrusions of the second pair of each tie bar 320.

As indicated above, the tie bars 320 are integrally connected to the dambar 330 which circumvents the die pad 310. In the leadframe 300, the dambar 330 is provided in the form of a substantially quadrangular (e.g., square) ring which interconnects the distal ends of the tie bars 320, thus resulting in the dambar 330 extending in generally co-planar relation to the third segments of the tie bars 320. More particularly, as best seen in FIG. 4D, the dambar 330 defines four peripheral segments which extend in spaced, generally parallel relation to respective ones of the peripheral edge segments of the die pad 310. In the completed semiconductor package 400, the dambar 330 is singulated or removed from the leadframe 300 to electrically isolate other structural features of the leadframe 300 from each other.

As indicated above, each of the tie bars 320 is integrally connected to the dambar 330. In addition, each of the tie bars 320 is integrally connected to a land connecting bar 340 which, like the dambar 330, circumvents the die pad 310. In this regard, the land connecting bar 340 includes four peripheral segments which extend in spaced, generally parallel relation to respective ones of the peripheral edge segments of the die pad 310. Additionally, the land connecting bar 340 is concentrically positioned between the dambar 330 and the die pad 310, and is integrally connected to the tie bars 320 between the die pad 310 and the first downsets 321 of the tie bars 320. As seen in FIG. 4D, each of the peripheral segments of the land connecting bar 340 includes a pair of chamfer portions which define the junctions with respective ones of the tie bars 320 of the pair between which such peripheral segment extends. Each chamfer portion is formed to extend at a predetermined angle relative the remainder of the peripheral segment upon which it is included, and further extends generally perpendicularly relative to the tie bar 320 to which it is integrally connected. The use of the chamfer portions of the land connecting bar 340 will be discussed in more detail below.

The leadframe 300 further comprises a plurality of first leads 360 which are each integrally connected to the land connecting bar 340, and protrude inwardly toward the die pad 310. More particularly, as best seen in FIG. 4D, the first leads 360 are segregated into four sets, with each set of the first leads 360 protruding inwardly from a respective one of the peripheral segments of the land connecting bar 340 toward the die pad 310. The first leads 360 of each set are arrange at a predetermined pitch and protrude perpendicularly inward at a predetermined length from a respective one of the peripheral segments of the land connecting bar 340. Each of the first leads 360 has a generally planar top surface which extends in generally co-planar relation to the top surface of the die pad 310, and a generally planar bottom surface which extends in generally co-planar relation to the bottom surface of the die pad 310 and defines a land 365. The top surface of each first lead 360 defines a wire bonding area 366 thereof.

In the semiconductor package 400 including the leadframe 300, the semiconductor die overlaps an inner end portion of the top surface of each first lead 360. As best seen in FIGS. 4C and 4D, formed in the bottom surface of each first lead 360 is a half-etched portion 364 which is disposed in opposed relation to the inner end portion defined by the top surface or wire bonding area 366 thereof. Thus, the half-etched portion 364 of each first lead 360 defines the bottom surface of the inner end portion thereof. Though FIG. 4D is a top perspective view of the leadframe 300, the half-etched portion 364 of each first lead 360 is indicated by the condensed hatching shown in FIG. 4D. The half-etched portion 364 extends between the land 365 and the inner, distal end of the first lead 360. As is most apparent from FIG. 4C, the land 365 defined by each first lead 360 extends in generally co-planar relation to the generally planar bottom surface of the die pad 310 which is circumvented by the half-etched portion 311. Along these lines, the generally planar top surface of each first lead 360 extends in generally co-planar relation to the generally planar top surface of the die pad 310. Further, as is also apparent from FIG. 4C, the half-etched portion 364 of each first lead 360 may extend in generally co-planar relation to the half-etched portion 311 of the die pad 310. In the leadframe 300, it is contemplated that the half-etched portion 364 of each of the first leads 360 can be formed by either half-etching as described above, or alternatively by forging. During the fabrication process for the semiconductor package 400 including the leadframe 300, the encapsulant material used to form the package body of the semiconductor package 400 is able to flow over the half-etched portions 364, thus facilitating a strong mechanical bond or interlock between each of the first leads 360 and the package body despite the lands 365 being exposed in such package body. This mechanical interlock assists in preventing the first leads 360 from being dislodged from the package body during a subsequent sawing process involved in the fabrication of the semiconductor package 400, as will also be described in more detail below. The half-etched portion 364 of each first lead 360 also serves to prevent insufficient filling or complete separation of the package body in the vicinity of the lands 365, and further serves to fix the first leads 360 within the package body such that the lands 365 do not protrude from the bottom surface of the package body, but rather are substantially flush or continuous therewith as will be described in more detail below.

The leadframe 300 of the semiconductor package 400 further comprises a plurality of second leads 350 which are integrally connected to the land connecting bar 340 and extend outwardly toward the dambar 330. More particularly, the second leads 350 are segregated into four sets, with the second leads 350 of each set being integrally connected to and extending generally perpendicularly outward from a respective one of the four peripheral segments defined by the land connecting bar 340. The second leads 350 of each set are arrange at a predetermined pitch and protrude perpendicularly outward at a predetermined length from a respective one of the peripheral segments of the land connecting bar 340. In addition to being integrally connected to the land connecting bar 340, the second leads 350 are each integrally connected to the dambar 330. Thus, the second leads 350 of each set extend generally perpendicularly between a corresponding pair of the peripheral segments of the land connecting bar 340 and dambar 330.

As seen in FIGS. 4C and 4D, each of the second leads 350 is bent to include a first downset 351 and a second downset 352. The first downset 351 of each second lead 350 is disposed between the second downset 352 and the land connecting bar 340. Due to the inclusion of the first and second downsets 351, 352 therein, each of the second leads 350 includes a first segment which is disposed between the land connecting bar 340 and the first downset 351 and extends in generally co-planar relation to the die pad 310 and first leads 360, a second segment which extends between the first and second downsets 351, 352 and resides on a plane which is elevated above that of the die pad 310, and a third segment which extends between the second downset 352 and the dambar 330 and resides on a plane which is elevated above that of the second segment. Thus, the first, second and third segments of each second lead 350 reside on respective ones of three spaced, generally parallel planes, with the plane upon which the second segment resides being disposed between those planes on which respective ones of the first and third segments reside. As indicated above, the die pad 310, the land connecting bar 340, the first leads 360, and the first segments of the tie bars 320 reside on the first plane, with the second segments of the tie bars 320 residing on the second plane, and the dambar 330 and the third segments of the tie bars 320 residing on the third plane.

The generally planar bottom surface of the first segment of each second lead 350 defines a land 355. The land 355 defined by each second lead 350 extends in generally co-planar relation to the generally planar bottom surface of the die pad 310 which is circumvented by the half-etched portion 311, and further extends in generally co-planar relation to the land 365 defined by each first lead 360. Along these lines, the first segment of each second lead 350 further defines a generally planar top surface which extends in generally co-planar relation to the generally planar top surface of the die pad 310, and also to the generally planar top surfaces of the first leads 360. The third segment of each second lead 350 extends in generally co-planar relation to the dambar 330. As best seen in FIG. 4B, the lands 365 defined by the first leads 360 of each set are linearly aligned with respective ones of the lands 355 defined by the second leads 350 of the corresponding set, the lands 355, 365 each being exposed in and substantially flush with an exterior surface defined by the package body of the semiconductor package 400 so as to be electrically connectable to an underlying substrate such as a printed circuit board.

In addition to defining the land 355, each of the second leads 350 further includes a wire bonding area 356 defined by the top surface of the second segment thereof which, as indicated above, extends between the first and second downsets 351, 352. Thus, as will be recognized, the wire bonding area 356 is situated at a higher level than the die pad 310. As will be discussed in more detail below, the wire bonding area 356 of each of the second leads 350 provides an area for the electrical bonding of conductive wires.

As best seen in FIG. 4C, each of the second leads 350 may further include a notch cut 357 disposed at the bent portion of the second lead 350 where the first downset 351 and the land 355 meet. The notch cuts 357 prevent the occurrence of rolling over at the bent portions during formation of the first downsets 351. As a result, the package body of the semiconductor package 400 including the leadframe 300 is protected from being broken at the bent portions, and the lands 355 are protected from being irregularly deformed, thus enabling stable mounting of the semiconductor package on an underlying structure such as a printed circuit board (PCB).

The leadframe 300 constructed in accordance with the present invention further comprises a plurality of third leads 370 which are integrally connected to the dambar 330. More particularly, the third leads 370, like the second leads 350, are preferably segregated into four sets, with each set of the third leads 370 extending between an adjacent pair of the tie bars 320. The third leads 370 of each set also extend generally perpendicularly relative to a respective one of the peripheral segments of the dambar 330 at a predetermined length, the third leads 370 of each set also being arranged at a predetermined pitch. Each of the third leads 370 includes an inner portion 372 which extends extend inwardly from the dambar 330 toward the die pad 310 in spaced relation thereto. In addition to the inner portion 372, each of the third leads 370 includes an outer portion 380 which extends extend outwardly from the dambar 330 away from the die pad 310. The outer portions 380 are preferably linearly aligned with respective ones of the inner portions 372. As is apparent from FIG. 4D, the inner portions 372 are shorter in length than the second leads 350. Additionally, certain ones of the inner portions 372 of each set of the third leads 370 have a generally linear configuration, and extend between a respective, adjacent pair of the second leads 350 in spaced relation thereto. Those inner portions 372 of each set of the third leads 370 which do not extend between an adjacent pair of the second leads 350 each preferably have an angled configuration so as to be disposed closer to a respective one of the peripheral edge segments of the die pad 310.

In the leadframe 300, each of the inner portions 372 which has a generally straight or linear configuration and extends between an adjacent pair of the second leads 350 is preferably bent to include a downset 371. Due to the inclusion of the downset 371 therein, each of the inner portions 372 includes a first segment which is disposed between the downset 371 and the die pad 310, and a second segment which extends between the downset 371 and the dambar 330. The first segments of the inner portions 372 preferably reside on the same plane as the second segments of the second leads 350. Similarly, the second segments of the inner portions 372 preferably reside on the same plane as the third segments of the second leads 350 and the dambar 330. In this regard, each of the inner portions 372 includes a wire bonding area 376 which is defined by the top surface of the first segment thereof and extends from the downset 371 to the distal end of the inner portion 372 defined by the first segment. The wire bonding areas 376 of the inner portions 372 extend in generally co-planar relation to the wire bonding areas 356 of the second leads 350. Like the wire bonding areas 366 of the first leads 360 and the wire bonding areas 356 of the second leads 350, the wire bonding areas 376 of the inner portions 372 of the third leads 370 provide areas for the electrical bonding of conductive wires, as will be described in more detail below. In the leadframe 100, it is contemplated that for ease of wire bonding, gold or silver may be plated on the wire bonding areas 146, 156. Alternatively, the leadframe 100 may a pre-plated leadframe (PPF) to provide enhanced wire bonding areas. In the leadframe 300, it is contemplated that for ease of wire bonding, gold or silver may be plated on the wire bonding areas 366, 356, 376. Alternatively, the leadframe 300 may a pre-plated leadframe (PPF) to provide enhanced wire bonding areas.

In the leadframe 300, the outer portions 380 of the third leads 370, the dambar 330, the second segments of the inner portions 372 of the third leads 370, and the third segments of the second leads 350 all reside on a common plane. In the process of fabricating the semiconductor package 400 as will be described in more detail below, the dambar 330 is ultimately singulated in a manner wherein each outer portion 380 remains integrally connected to a respective one of the inner portions 372, with each connected pair of the inner and outer portions 372, 380 (and thus each third lead 370) being electrically isolated from every other third lead 370. The singulation of the dambar 330 also occurs in a manner wherein the second leads 350 are electrically isolated from each other, and from the third leads 370.

The leadframe 300 of the semiconductor package 400 may be fabricated from a conventional metal material, such as copper, copper alloy, steel plated with copper, or a functional equivalent. However, those of ordinary skill in the art will recognize that the present invention is not limited to any particular material for the leadframe 300. Additionally, the number of first, second and third leads 360, 350, 370 shown in FIG. 4D is for illustrative purposes only, and may be modified according to application field. Along these lines, the first, second and third leads 360, 350, 370 may have designs or configurations varying from those shown in FIG. 4D without departing from the spirit and scope of the present invention. Additionally, though the first, second and third leads 360, 350, 370 are each shown as each being segregated into four sets, it will be recognized that fewer sets thereof may be provided, and may be arranged along any combination of two or three of the peripheral sides of the die pad 310. Moreover, less than four tie bars 320 may be included in the leadframe 300, extending to respective corners of the die pad 310 in any combination. It is further contemplated that the leadframe 300 may be fabricated through the implementation of a chemical etching process or alternatively a mechanical stamping process.

Referring now to FIGS. 4A-4C, the semiconductor package 400 as fabricated to include the leadframe 300 is shown in detail. As will be recognized by those of ordinary skill in the art, in the completed semiconductor package 400, the dambar 330 and the land connecting bar 340 are each singulated or removed from the leadframe 300 to facilitate the electrical isolation of the various structural features of the leadframe 300 from each other. More particularly, the dambar 330 and the land connecting bar 340 are singulated in a manner wherein each outer portion 380 remains integrally connected to a respective one of the inner portions 370, with the third leads 370 further being electrically isolated from each other. The singulation of the dambar 330 and the land connecting bar 340 also occur in a manner wherein the second leads 350 are electrically isolated from each other, from the first leads 360 and from the third leads 370, with the first leads 360 being electrically isolated from each other, from the second leads 350 and from the third leads 370.

In the semiconductor package 400, a semiconductor die 410 is attached to and covers the generally planar top surface of the die pad 310, the generally planar inner end portions of the top surfaces of the first leads 360, and the inner end portions 324 of the top surfaces of the tie bars 320. Such attachment is preferably facilitated through the use of an adhesive layer 401. Prior to the removal of the land connecting bar 340, the semiconductor die 410 directly pushes down on and equally supports the die pad 310, the inner end portions of the first leads 360 (and hence the second leads 350 which are also connected to the land connecting bar 340), and the inner end portions 324 of the tie bars 320. Thus, the exposed lands 365 of the first leads 360 and the exposed lands 355 of the second leads 350 are effectively stabilized, which ensures their consistent shape and orientation with the semiconductor package 400. In other words, the semiconductor die 410 ensures the flatness or co-planarity of the lands 365, 355. If the lands 365, 355 are not co-planar, a large amount of flash (a portion of the encapsulant used to form the package body of the semiconductor package 400) may occur on the lands 365, 355 during the fabrication of the semiconductor package 400. The adhesive layer 401 is preferably a film type adhesive possessing the same attributes of the adhesive layer 201 described above in relation to the semiconductor package 200. The semiconductor die 410 includes a plurality of bond pads 411 which are disposed on the top surface thereof opposite the bottom surface adhered to the adhesive layer 201. The bond pads 411 are used to deliver and receive electrical signals.

The semiconductor package 400 further comprises a plurality of conductive wires 420 which are used to electrically connect the bond pads 411 of the semiconductor die 410 to respective ones of the first leads 360, second leads 350 and third leads 370. The conductive wires 420 may be fabricated from aluminum, copper, gold, silver, or a functional equivalent. However, those of ordinary skill in the art will recognize that the present invention is not limited to any particular material for the wires 420.

In the semiconductor package 400, in electrically connecting the bond pads 411 to the first leads 360, it is contemplated that the conductive wires 420 will be extended from the bond pads 411 to the wire bond areas 366 defined by the first leads 360. In electrically connecting the bond pads 411 to the second leads 350, it is contemplated that the conductive wires 420 will be extended from the bond pads 411 to the wire bonding areas 356 defined by the second segments of respective ones of the second leads 350. However, it is contemplated that the electrical connection of the bond pads 411 of the semiconductor die 410 to the second leads 350 may be facilitated by extending the conductive wires 420 between the bond pads 411 and the top surfaces of the first segments of respective ones of the second leads 350. The electrical connection of the bond pads 411 of the semiconductor die 410 to the third leads 370 is preferably facilitated by extending the conductive wires 420 from the bond pads 411 to the wire bonding areas 376 defined by the first segments of respective ones of the inner portions 372 of the third leads 370. Since the wire bonding areas 356 of the second leads 350 extend in generally co-planar relation to the wire bonding areas 376 of the inner portions 372 of the third leads 370, the conductive wires 420 can be bonded to the wire bonding areas 356, 376 by repeatedly reciprocating capillaries at the same height to maintain constant wiring bonding quality.

In the semiconductor package 400, the die pad 310, the first leads 360, the tie bars 320, the second leads 350, the inner portions 372 of the third leads 370, the semiconductor die 410 and the conductive wires 420 are at least partially encapsulated or covered by an encapsulant material which, upon hardening, forms the package body 430 of the semiconductor package 400. More particularly, the package body 430 covers the entirety of the die pad 310 except for the bottom surface thereof which is circumvented by the half-etched portion 311.

The package body 430 also covers the entirety of each of the first leads 360 except for the land 365 defined thereby, as well as the entirety of each of the second leads 350 except for the land 355 defined thereby and a small portion of the third segment thereof. The package body 430 also covers the entirety of each of the inner portions 372 of the third leads 370 except for a small portion of the second segment thereof. The entirety of each of the tie bars 320 is also covered by the package body 430, except for the bottom surface of the first segment of each tie bar 320 which extends in generally co-planar relation to the bottom surface of the die pad 310 and the lands 355, 365, all of which are exposed in a generally planar bottom surface 432 defined by the package body 430. The outer portions 380 of the second leads 370 of the leadframe 300 are not covered by the package body 430, but rather protrude or extend outwardly from respective lateral side surfaces 431 thereof. The dambar 330 is also not covered by the package body 430 so that it may be removed from the leadframe 300.

Though the land connecting bar 340 is partially covered by the package body 430, the bottom surface of the land connecting bar 340 is exposed in the bottom surface 432 so that the land connecting bar 340, like the dambar 330, may be removed from the completed semiconductor package 400 as needed to facilitate the electrical isolation of various structural features thereof from each other. More particularly, the removal of the land connecting bar 340 is needed to facilitate the electrical isolation of the first leads 360 from each other, and from the second leads 350, and further to facilitate the electrical isolation of the second leads 350 from each other. As shown in FIG. 4B, the removal of the land connecting bar 340, which is typically accomplished through the completion of a partial sawing process subsequent to the formation of the package body 430, facilitates the formation of a plurality of elongate grooves 440 within the bottom surface 431 of the package body 430, such grooves 440 extending in generally perpendicular relation to each other, and generally perpendicularly between an opposed pair of the lateral side surfaces 431 of the package body 430.

Due to the structural attributes of the fully formed package body 430, the generally planar bottom surface of the die pad 310 is exposed in and substantially flush with the generally planar bottom surface 432 of the package body 430, as are the generally planar bottom surfaces of the first segments of the tie bars 320. Similarly, the generally planar lands 365, 355 defined by the first and second leads 360, 350 are exposed in and substantially flush with the bottom surface 432 of the package body 430. The outer portions 380 of the third leads 370 of each set thereof protrude laterally outward from respective side surfaces 431 of the package body 430. As seen in FIGS. 4A-4C, the exposed outer portions 380 may be bent to assume a gull-wing configuration to allow the same to be electrically connected to an underlying substrate such as a printed circuit board. As indicated above, in order to complete the fabrication of the semiconductor package 400 to allow the same to assume the configuration shown in FIGS. 4A and 4B, the dambar 330 and the land connecting bar 340 must each be removed from the leadframe 300 to facilitate the electrical isolation of the first leads 360, the second leads 350, and the third leads 370 from each other as explained above. In this regard, it is contemplated that a conventionally known debarring process may be implemented to remove the dambar 330. The completion of such debarring process results in each of the second leads 350 defining an outer, distal end which is exposed in and substantially flush with a respective side surface 431 defined by the package body 430. The removal of the land connecting bar 340 is facilitated by sawing with a blade, the grooves 440 being formed as an artifact of such sawing process.

As indicated above, the outer portions 380 of the second leads 370 are exposed in the semiconductor package 400, as are the lands 355, 365. As a result, the lands 355, 365 are capable of being mounted to the surface of an underlying substrate such as a printed circuit board through the use of, for example, a soldering technique. Electrical signals are routed between the lands 355, 365 and the semiconductor die 410 by the corresponding first and second leads 360, 350 and conductive wires 420. Similarly, electrical signals may be routed from the semiconductor die 410 to the outer portions 380 of the second leads 370 by the corresponding integrally connected inner portions 372 and conductive wires 420. Like the lands 355, 365, the outer portions 380 may be surface mounted to an underlying substrate such as a printed circuit board through the use of, for example, a soldering technique. Since the leadframe 300 of the semiconductor package 400 is configured to provide the outer portions 380 which protrude from the side surfaces 431 of the package body 430 and the lands 355, 365 which are exposed in the bottom surface 432 of the package body 430, the number of I/O's in the leadframe 300 increases in proportion to the number of the third leads 370 and the lands 355, 365.

Figure 5A:
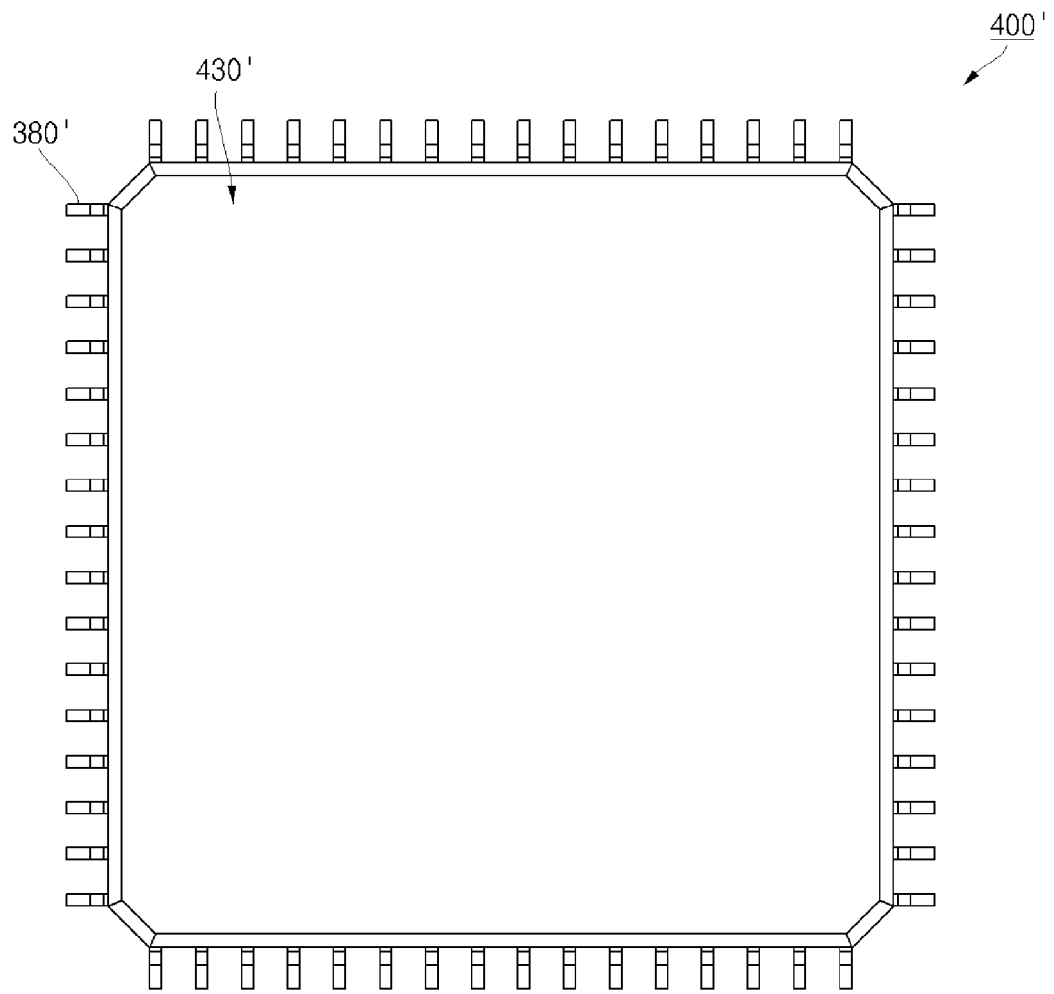
FIG. 5A is a top plan view of a semiconductor package constructed in accordance with a third embodiment of the present invention.
Figure 5B:
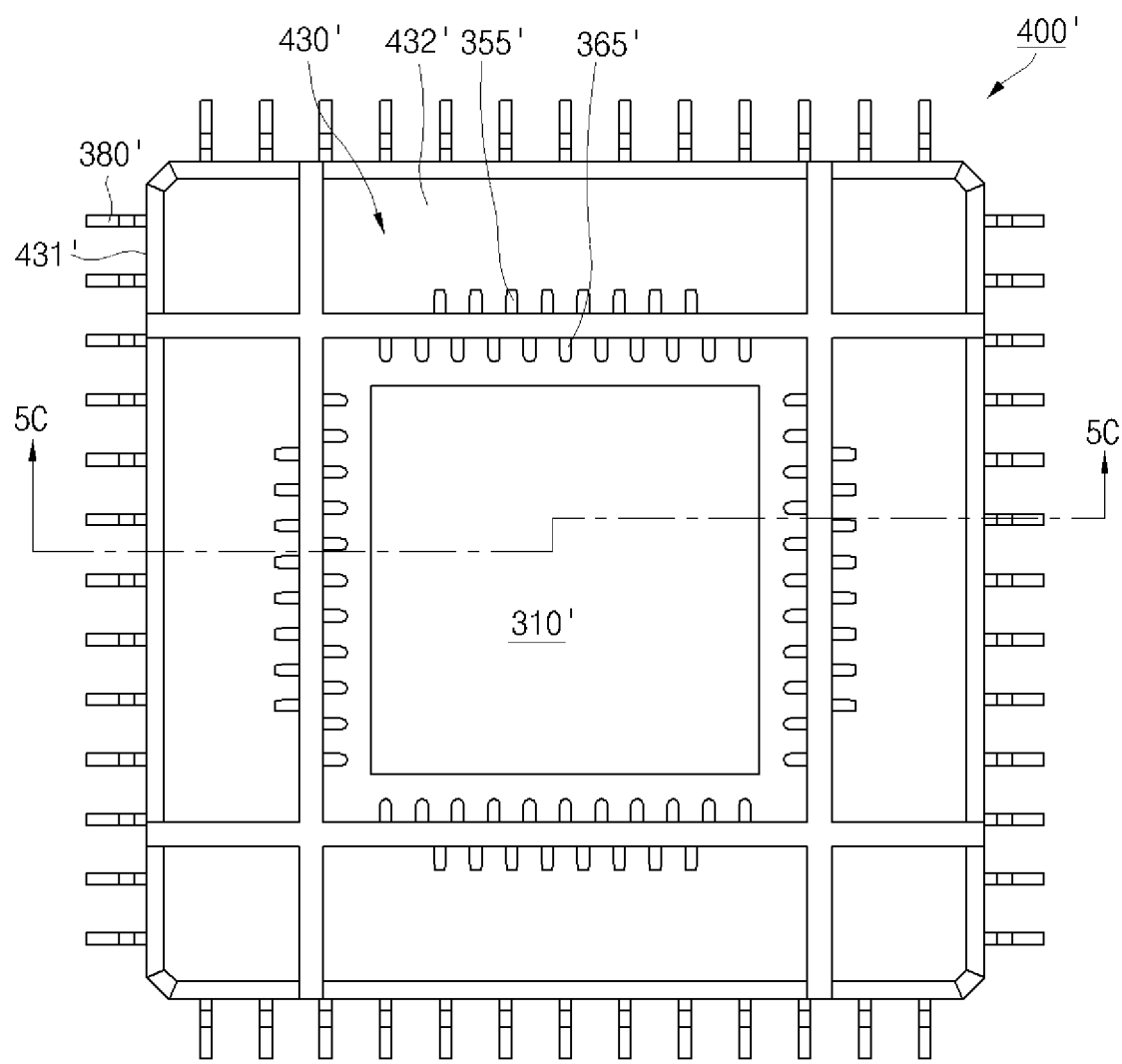
FIG. 5B is a bottom plan view of the semiconductor package shown in FIG. 5A.
Figure 5C:
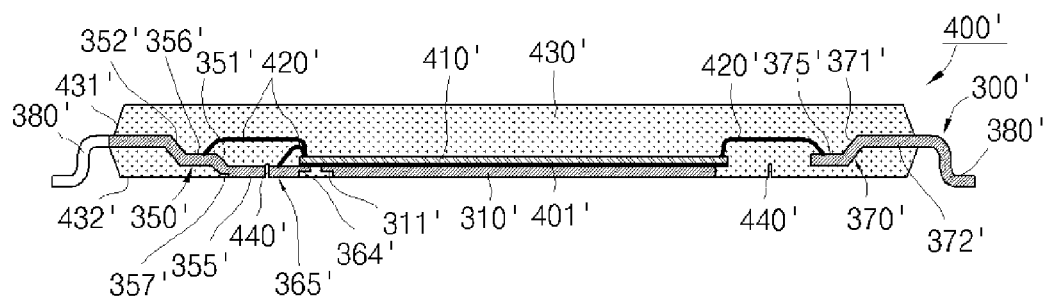
FIG. 5C is a cross-sectional view taken along line 5C-5C of FIG. 5B.

Referring now to FIGS. 5A-5C, there is shown a semiconductor package 400' constructed in accordance with a third embodiment of the present invention. The leadframe 300' integrated into the semiconductor package 400' is shown in its unsingulated state in FIG. 5D. The semiconductor package 400' bears substantial similarity to the semiconductor package 400 described above. Thus, only the distinctions between the semiconductor packages 400, 400' will be highlighted below. It should be noted that the common structural features of the semiconductor packages 400, 400' are identified by the same reference numbers in FIGS. 4A-4D and 5A-5D, with those reference numbers used in conjunction with the semiconductor package 400' in FIGS. 5A-5D being accompanied by an apostrophe.

Figure 5D:
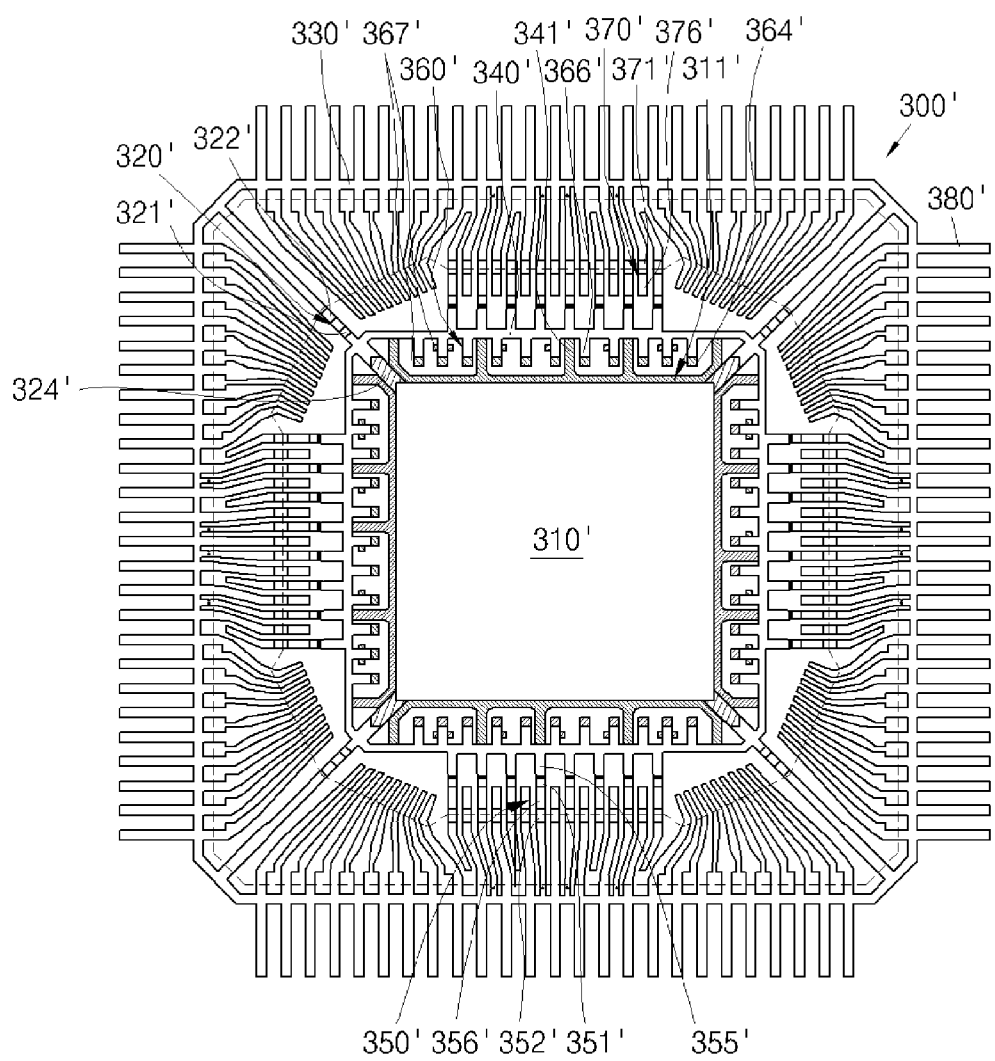
FIG. 5D is a top plan view of an unsingulated leadframe which is integrated into the semiconductor package shown in FIGS. 5A-5C.

The leadframe 300' differs from the leadframe 300 by virtue of its inclusion of a plurality of support bars 341' which are integrally connected to and extend between the die pad 310' and the land connecting bar 340'. In this regard, the support bars 341' function to connect the die pad 310' to, and to support the die pad 310' within, the interior of the land connecting bar 340'. The support bars 341' are segregated into four sets, with each set of the support bars 341' extending generally perpendicularly between a respective one of the peripheral edge segments of the die pad 310' and a corresponding peripheral segment of the land connecting bar 340'. As seen in FIG. 5D, certain ones of the support bars 341' extend between an adjacent pair of the first leads 360', with certain ones of the support bars 341' extending between a first lead 360' and a respective one of the tie bars 320'.

Each of the support bars 341' has a generally planar top surface which extends in generally co-planar relation to the top surface of the die pad 310'. As seen in FIG. 5D, each of the support bars 341' is preferably half-etched so as to define a bottom surface which extends in generally co-planar relation to the half-etched portion 311' of the die pad 310'. Though FIG. 5D is a top plan view of the leadframe 300', the half-etched surface of each support bar 431' is indicated by the condensed hatching shown in FIG. 5D. In the process of fabricating the semiconductor package 400', the encapsulant material used to form the package body 430' of the semiconductor package 400' is able to flow over the bottom surfaces of the support bars 431', and thus completely covers or encapsulates each support bar 431'. Such encapsulation of the support bars 431' prevents the same from effecting the connection of the completed semiconductor package 400' to an external circuit.

A further distinction between the semiconductor packages 400, 400' lies in each of the first leads 360' being formed to include one or more integral locking protrusions 367' which protrude from one or both sides thereof. Each of the locking protrusions 376' is preferably half-etched as indicated by the condensed hatching shown in FIG. 5D such that each locking protrusion 367' defines a generally planar top surface which extends in generally co-planar relation to the top surface of the corresponding first lead 360', and a bottom surface which is recessed relative to the land 365' defined by the corresponding first lead 360'. Though, as indicated above, FIG. 5D is a top plan view of the leadframe 300', the half-etched surface of each locking protrusion 367' is indicated by the condensed hatching included therein. In the process of fabricating the semiconductor package 400', the encapsulant material used to form the package body 430' completely covers or encapsulates each locking protrusion 367' to effectively form a mechanical interlock between the first leads 360' and the package body 430'. This mechanical interlock assists in preventing the first leads 360' from being dislodged from the package body 430' during the sawing process used to facilitate the removal of the land connecting bar 340'.

A further distinction between the semiconductor packages 400, 400' lies in only some of the second leads 350' being integrally connected to the dambar 330', with other ones of the second leads 350' terminating so as to be disposed in spaced relation to the dambar 330'. This is in contrast to the leadframe 300 wherein each of the second leads 350 is integrally connected to the dambar 330, in addition to being integrally connected to the land connecting bar 340. Additionally, in the leadframe 300' and as shown in FIG. 5D, certain ones of the first segments are the second leads 350' of each set may be linearly aligned with respective ones of the support bars 341' of that set attached to the corresponding peripheral edge segment of the die pad 310'.

Figure 6A:
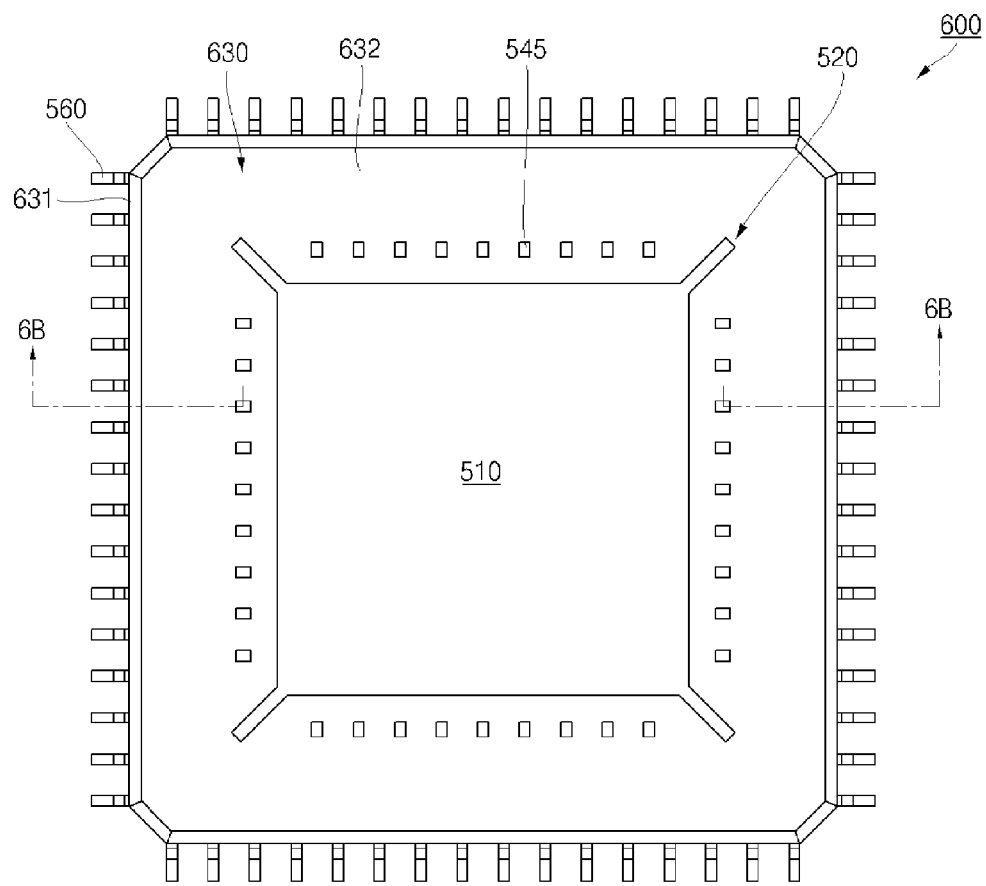
FIG. 6A is a top plan view of a semiconductor package constructed in accordance with a fourth embodiment of the present invention.
Figure 6B:
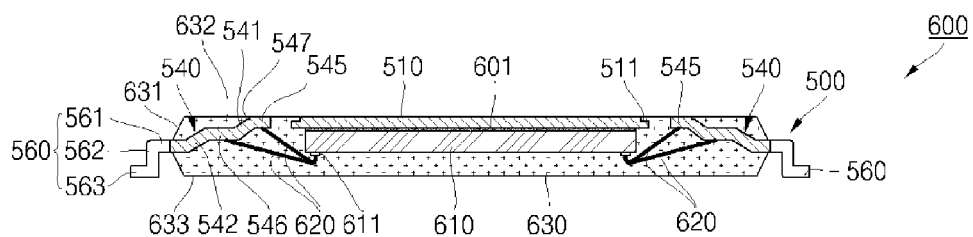
FIG. 6B is a cross-sectional view taken along line 6B-6B of FIG. 6A.

Referring now to FIGS. 6A and 6B, there is shown a semiconductor package 600 constructed in accordance with a fourth embodiment of the present invention. The leadframe 500 integrated into the semiconductor package 600 is shown in its unsingulated state in FIG. 6C.

Figure 6C:
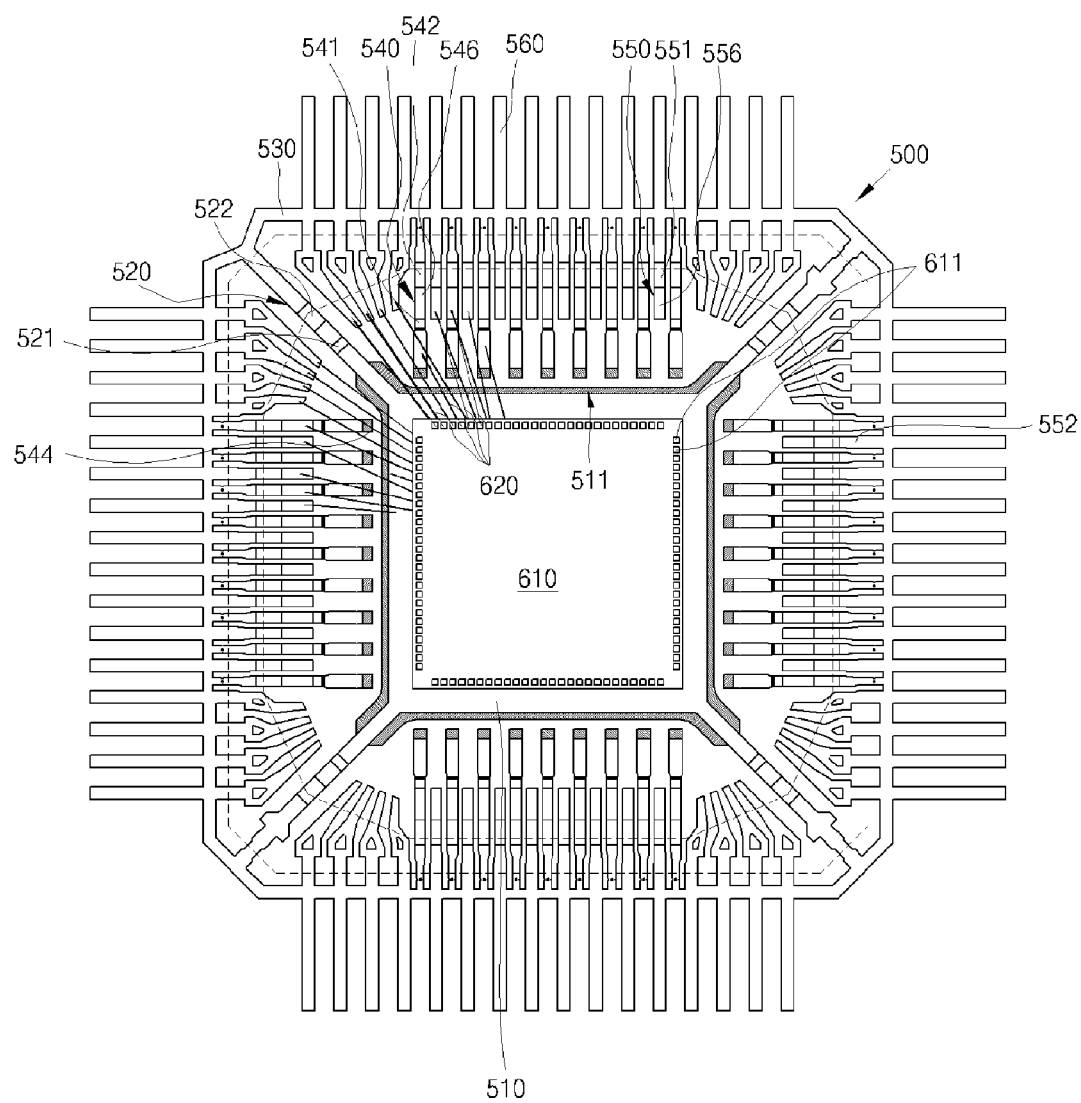
FIG. 6C is a bottom plan view of an unsingulated leadframe which is integrated into the semiconductor package shown in FIGS. 6A and 6B, further illustrating a semiconductor die as attached to the leadframe.

In its unsingulated state shown in FIG. 6C, the leadframe 500 integrated into the semiconductor package 600 is identically configured to the above-described unsingulated leadframe 100 which is shown in FIG. 1D and integrated into the semiconductor package 200. In this regard, the 500 series reference numbers included in FIG. 6C identify structural features of the leadframe 500 corresponding to those identified with the 100 series reference numbers included in FIG. 1D. Thus, like the leadframe 100 described above, the leadframe 500 includes a die pad 510 which defines a half-etched portion 511, a plurality of tie bars 520 which integrally connect the die pad 510 to a dambar 530, a plurality of first leads 540 which are integrally connected to the dambar 530, and a plurality of second leads 550 which are integrally connected to the dambar 530. Like the tie bars 120 described in relation to the leadframe 100, the tie bars 520 of the leadframe 500 each include first and second downsets 521, 522 formed therein. Additionally, each of the first leads 540 is bent to include first and second downsets 541, 542, with a wire bonding area 546 being defined between the first and second downsets 541, 542. Each first lead 540 also defines a land 545, and includes a half-etched portion 544 and a notch cut 547 formed therein. In addition, the inner portion 552 of each of the second leads 550 includes a downset 551 formed therein, and defines a wire bonding area 556. In the completed semiconductor package 600 including the leadframe 500, the outer portions 560 of the second leads 550 protruding from the side surfaces of the package body of the semiconductor package 600 including the leadframe 500 are bent in a manner differing from the manner in which the outer portions 180 of the leadframe 100 integrated into the semiconductor package 200 are bent, as will be discussed in more detail below.

In the semiconductor package 600 shown in FIGS. 6A and 6B, a semiconductor die 610 is attached to the generally planar top surface of the die pad 510. Such attachment is facilitated through the use of an adhesive layer 601 which is preferably a film type adhesive possessing the same attributes of the adhesive layer 201 described above in relation to the semiconductor package 200. The semiconductor die 610 includes a plurality of bond pads 611 which are disposed on the top surface thereof opposite the bottom surface adhered to the adhesive layer 601. The bond pads 611 are used to deliver and receive electrical signals.

In the semiconductor package 600, a plurality of conductive wires 620 are used to electrically connect the bond pads 611 of the semiconductor die 610 to respective ones of the first leads 540 and the inner portions 552 of the second leads 550. The conductive wires 620 may be fabricated from the same material described above in relation to the conductive wires 220 of the semiconductor package 200. In electrically connecting the bond pads 611 to the first leads 540, it is contemplated that the conductive wires 620 will be extended from the bond pads 611 to the wire bonding areas 546 defined by the second segments of respective ones of the first leads 540. However, as shown in FIG. 6B, the electrical connection of the bond pads 611 of the semiconductor die 610 to the first leads 540 may also be facilitated by extending the conductive wires 620 between the bond pads 611 and the top surfaces of the first segments of respective ones of the first leads 540. The electrical connection of the bond pads 611 to the inner portions 552 of the second leads 550 is preferably facilitated by extending the conductive wires 620 from the bond pads 611 to the wire bonding areas 556 defined by the first segments of respective ones of the inner portions 552.

In the semiconductor package 600, the die pad 510, the tie bars 520, the first leads 540, the inner portions 552 of the second leads 550, the semiconductor die 610 and the conductive wires 620 are at least partially encapsulated or covered by an encapsulant material which, upon hardening, forms a package body 630 of the semiconductor package 600. More particularly, the package body 630 covers the entirety of the die pad 510 except for the bottom surface thereof which is circumvented by the half-etched portion 511. The package body 630 also covers the entirety of each of the first leads 540 except for the land 545 defined thereby and a small portion of the third segment thereof. The package body 630 also covers the entirety of each of the inner portions 552 except for a small portion of the second segment thereof. The entirety of each of the tie bars 520 is also covered by the package body 630, except for the bottom surface of the first segment of each tie bar 520 which extends in generally co-planar relation to the bottom surface of the die pad 510 and the lands 545 defined by the first leads 540. The outer portions 560 of the second leads 550 of the leadframe 500 are not covered by the package body 630. The dambar 530 is also not covered by the package body 630 so that it may be removed from the leadframe 500.

In the semiconductor package 600 shown in FIGS. 6A and 6B, the package body 630 is formed such that the generally planar bottom surface of the die pad 510 is exposed in and substantially flush with the generally planar top surface 632 of the package body 630, as are the generally planar bottom surfaces of the first segments of the tie bars 520. Similarly, the generally planar land 545 defined by each first lead 540 is exposed in and substantially flush with the top surface 632 of the package body 630. The outer portions 560 of the second leads 550 of each set thereof protrude laterally outward from respective side surfaces 631 of the package body 630. As seen in FIGS. 6A and 6B, the exposed outer portions 560 are bent toward the generally planar bottom surface 633 of the package body 630 to assume a gull-wing configuration to allow the same to be electrically connected to an underlying substrate such as a printed circuit board. As indicated above, in order to complete the fabrication of the semiconductor package 600 to allow the same to assume the configuration shown in FIGS. 6A and 6B, dambar 530 must be removed from the leadframe 500 to facilitate the electrical isolation of the first and second leads 540, 550 from each other in the same manner described above regarding the removal of the dambar 130 from the leadframe 100 in fabricating the semiconductor package 200. In this regard, it is contemplated that a conventionally known debarring process may be implemented to remove the dambar 530, with the completion of such debarring process resulting in each of the first leads 540 defining an outer, distal end which is exposed in and substantially flush with a respective side surface 631 of the package body 630.

As indicated above, the outer portions 560 of the second leads 550 are exposed in the semiconductor package 600, as are the lands 545 defined by the first leads 540. However, rather than being exposed in the bottom surface 633 of the package body 630, the lands 545 are exposed in the top surface 632 of the package body as also indicated above. When bent to assume the gull-wing configuration, each outer portion 560 defines a first portion 561 which protrudes laterally from a respective side surface 631 of the package body 630, a second portion 562 which extends generally perpendicularly relative to the first portion 561 toward the bottom surface 633 of the package body 630, and a third portion 563 which extends generally perpendicularly relative to the second portion 562 away from the package body 630. As seen in FIG. 6B, the third portion 563 defines a bottom surface which extends in generally co-planar relation to the bottom surface 633 of the package body 630. In the semiconductor package 600, electrical signals are routed between the lands 545 and the semiconductor die 610 by the corresponding first leads 540 and conductive wires 620. Similarly, electrical signals are routed from the semiconductor die 610 to the outer portions 560 by the corresponding integrally connected inner portions 552 and conductive wires 620. The third portions 563 of the outer portions 560 may be surface mounted to an underlying substrate such as a printed circuit board through the use of, for example, a soldering technique. Since the leadframe 500 of the semiconductor package 600 is configured to provide the outer portions 560 which protrude from the side surfaces 631 of the package body 630, the number of I/O's in the leadframe 500 increases in proportion to the number of the second leads 550 and the lands 545.

Figure 7:
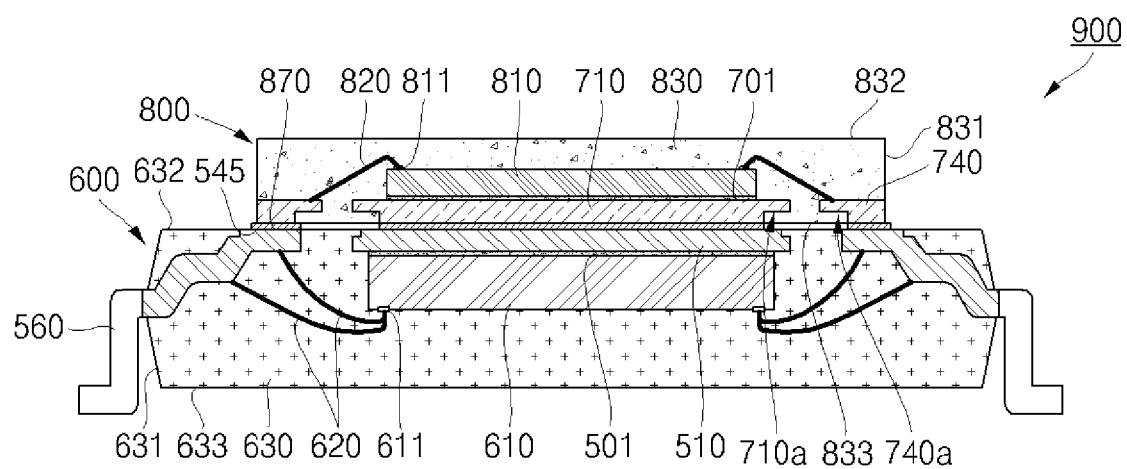
FIG. 7 is a cross-sectional view of a semiconductor package constructed in accordance with a fifth embodiment of the present invention.

Referring now to FIG. 7, there is shown a semiconductor package 900 constructed in accordance with a fifth embodiment of the present invention. The semiconductor package 900 comprises the above-described semiconductor package 600 in combination with a second semiconductor package 800 stacked thereon.

In the semiconductor package 900, the semiconductor package 800 includes a generally quadrangular die pad 710 having a peripheral half-etched portion 710a similar to the half-etched portion 511 of the die pad 510 included in the semiconductor package 600. In addition to the die pad 710, the semiconductor package 800 includes a plurality of leads 740 which are disposed in spaced relation to the peripheral edge segments of the die pad 710 and are preferably arranged to substantially circumvent the same. Each of the leads 740 includes a half-etched portion 740a which extends to the inner end thereof.

In addition to the foregoing, the semiconductor package 800 comprises a semiconductor die 810 which is attached to the top surface of the die pad 710 through the use of an adhesive layer 701. Disposed on the top surface of the semiconductor die 810 is a plurality of bond pads 811 which are electrically connected to the top surfaces of respective ones of the leads 740 through the use of conductive wires 820.

In the semiconductor package 800, the die pad 710, the leads 740, the semiconductor die 810 and the conductive wires 820 are at least partially encapsulated with an encapsulant material which, upon hardening, forms a package body 830 of the semiconductor package 800. The package body 830 is formed such that the generally planar bottom surface of the die pad 710 which is circumvented by the half-etched portion 710a is exposed in and substantially flush with the generally planar bottom surface 833 defined by the package body 830. Similarly, the generally planar bottom surfaces of the leads 740 are each exposed in and substantially flush with the bottom surface 833 of the package body 830. Similarly, the generally planar outer surfaces of the leads which define the outer ends thereof are exposed in and substantially flush with respective ones of the generally planar side surfaces 831 defined by the package body 830. Importantly, the half-etched portion 710a of the die pad 710 as well as the half-etched portions 740a of the leads 740, are each covered by the package body 830, thus creating a firm mechanical interlock between the package body 830 and the die pad 710 and leads 740. In the semiconductor package 800, no structural features thereof are exposed in the generally planar top surface 832 of the package body 830.

In the semiconductor package 900, the semiconductor package 800 is stacked on and electrically connected to the semiconductor package 600. More particularly, the lands 545 exposed in the top surface 632 of the package body 630 in the semiconductor package 600 are electrically connected to respective ones of the bottom surfaces of the leads 740 which are exposed in the bottom surface 833 of the package body 830 in the semiconductor package 800. Such electrical connection as preferably facilitated through the use of solder paste 870. Similarly, the bottom surface of the die pad 510 exposed in the top surface 632 of the package body 630 in the semiconductor package 600 is electrically connected to the bottom surface of the die pad 710 which is exposed in the bottom surface 833 of the package body 830 in the semiconductor package 800. Such electrical connection is also preferably facilitated through the use of solder paste 870. Since the semiconductor package 900 has a structure in which the semiconductor package 800 is stacked on the semiconductor package 600, such semiconductor package 900 is suitable for applications in various fields, such as semiconductor packages with high capacity and better performance. In addition, the mounting area of the semiconductor package 900 on an external device can be reduced as compared to the mounting area which would be required by the semiconductor package 600 and semiconductor package 800 separately.

Figure 8:
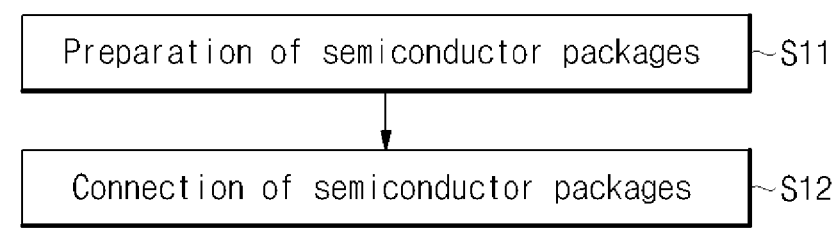
FIG. 8 is a flow chart illustrating an exemplary fabrication method for the semiconductor package shown in FIG. 7.
Figure 9A:
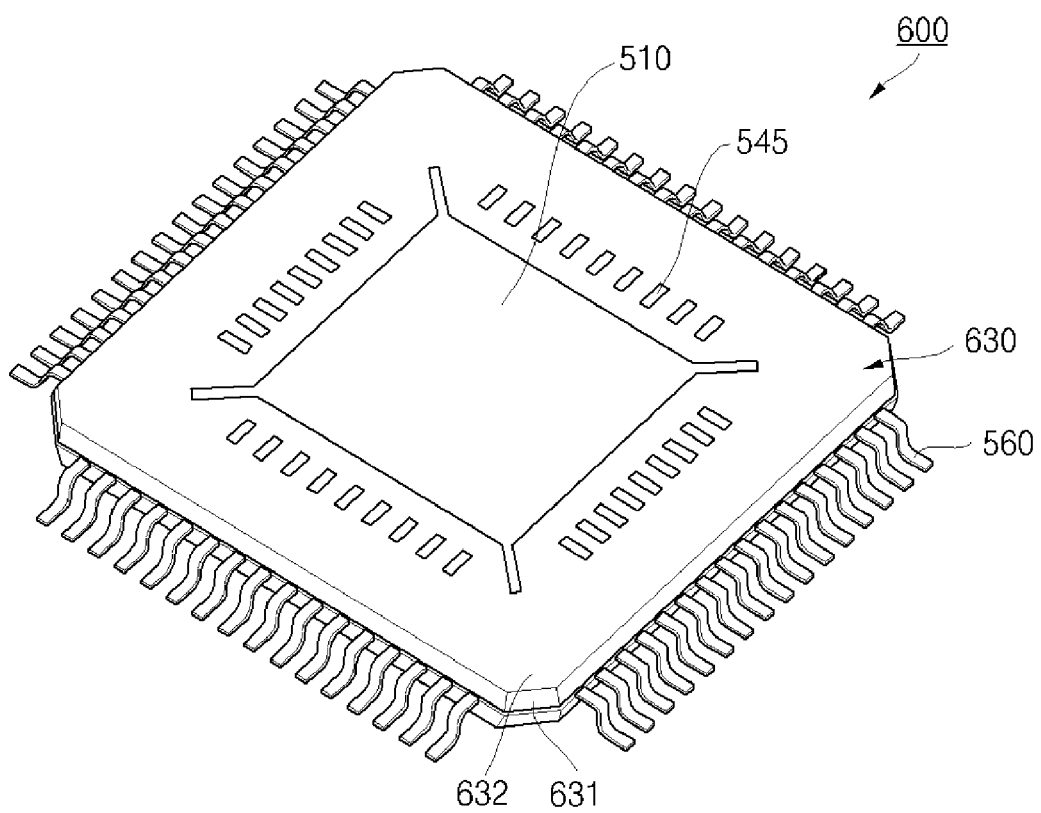
FIGS. 9A-9E are views illustrating an exemplary fabrication method for the semiconductor package shown in FIG. 7.
Figure 9B:
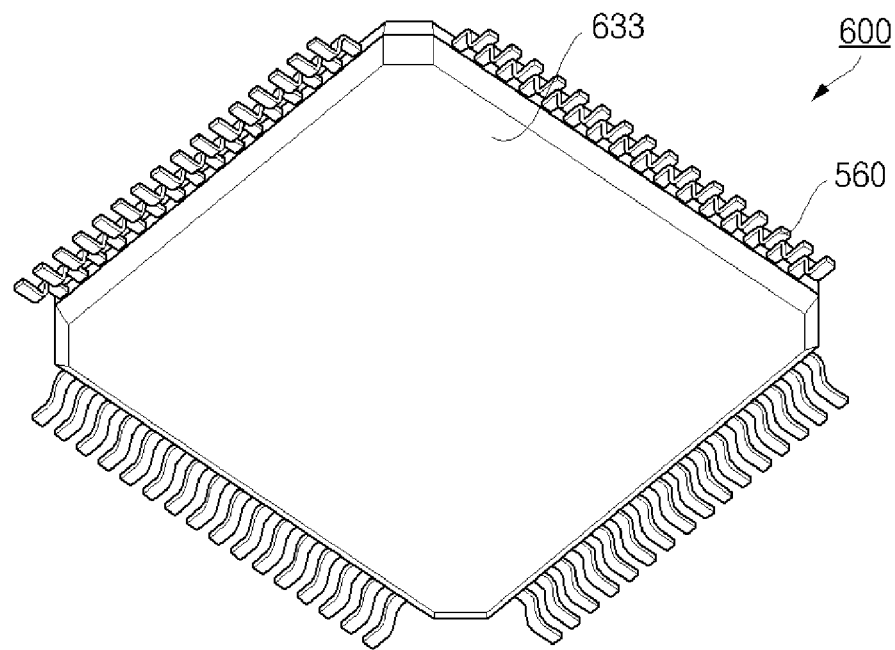
Figure 9C:
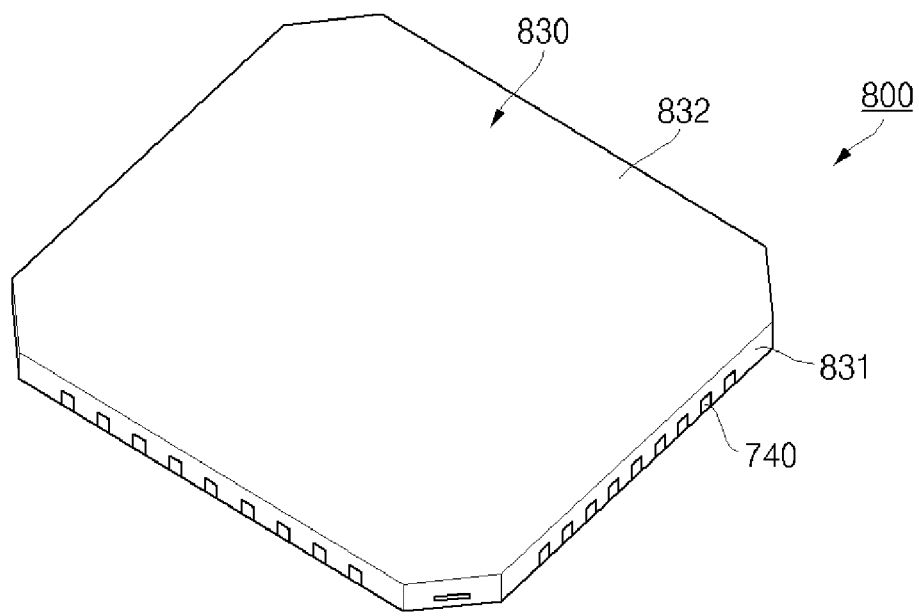
Figure 9D:
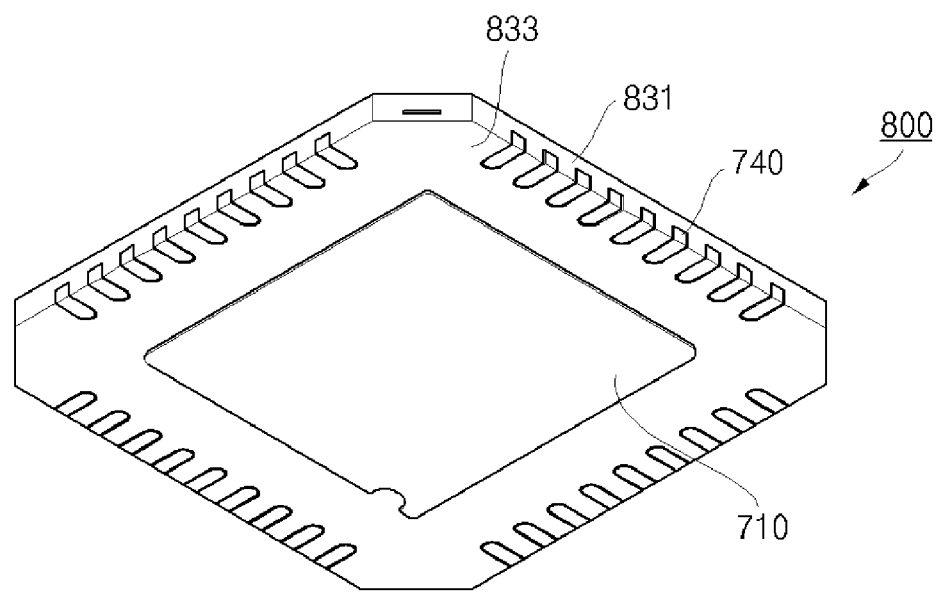
Figure 9E:
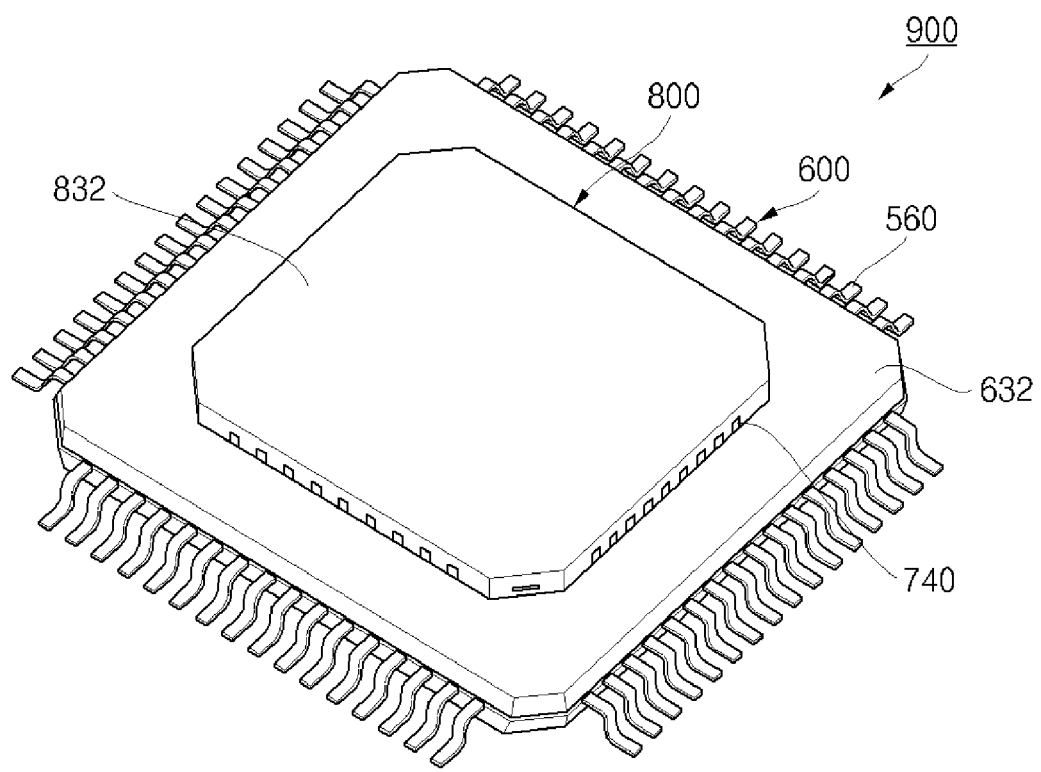
Figure 10:
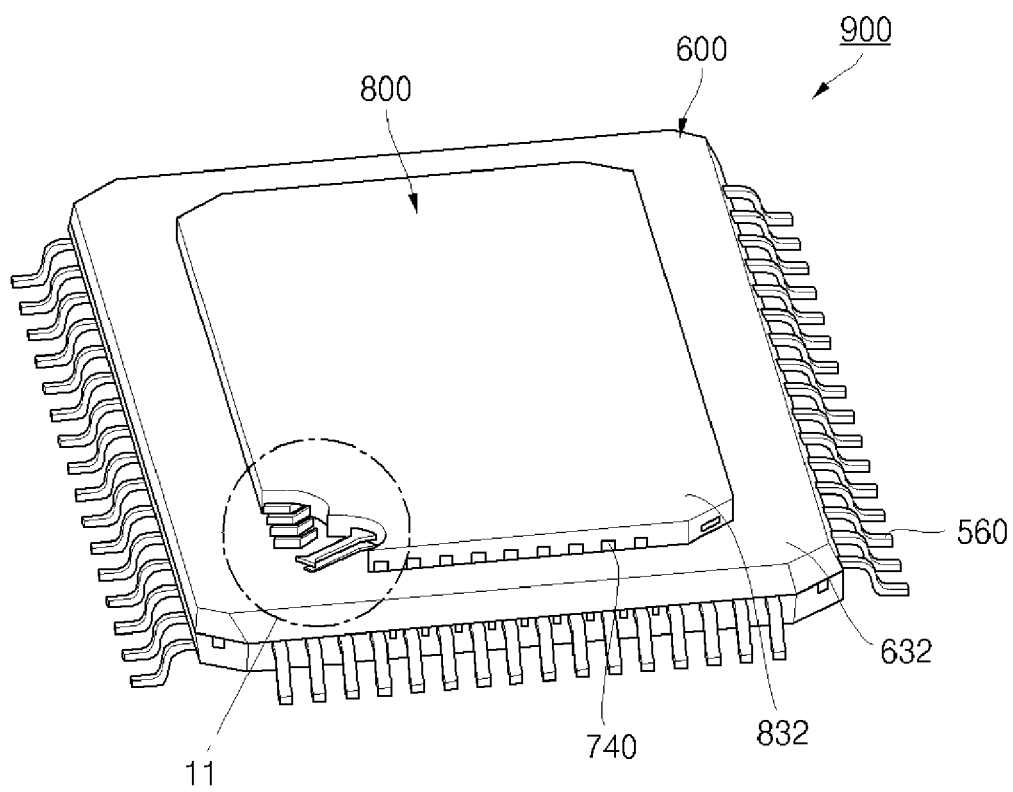
FIG. 10 is a partial cut-away perspective view of the semiconductor package shown in FIG. 7, illustrating an exemplary connection between first and second semiconductor devices of the semiconductor package.
Figure 11:
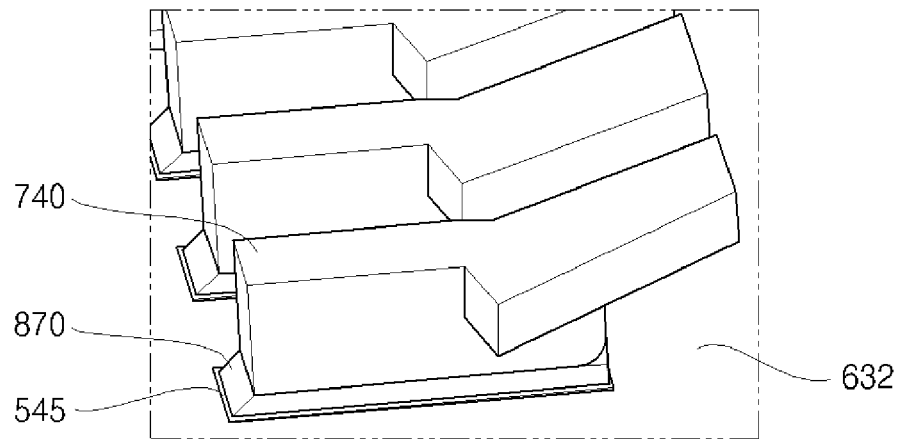
FIG. 11 is an enlargement of the encircled region 11 included in FIG. 10.

Referring now to FIG. 8, there is provided a flow chart which sets forth an exemplary method for fabricating the semiconductor package 900 as shown in FIG. 7. The method comprises the steps of preparing the semiconductor packages 600, 800 (S11), and thereafter connecting the semiconductor packages 600, 800 to each other (S12). FIGS. 9A-9E provide illustrations corresponding to these particular steps, as will be discussed in more detail below. Additionally, FIGS. 10 and 11 provide perspective views clearly depicting the connection between the semiconductor packages 600, 800 in the semiconductor package 900.

As shown in FIGS. 9A-9D, the first and second semiconductor packages 600, 800 are each fabricated to possess the above-described structural attributes in accordance with step S11. Thereafter, as shown in FIG. 9E, the semiconductor package 800 is stacked upon and electrically connected to the semiconductor package 600 in the above-described manner in accordance with step S12. The electrical connection of the semiconductor packages 600, 800 is completed in the manner described above in relation to FIG. 7. As indicated above, the electrical connection of the bottom surfaces of the leads 740 of the semiconductor package 800 to respective ones of the exposed lands 545 of the semiconductor package 600 through the use of the solder paste 870 is shown in detail in FIGS. 10 and 11.

Figure 12:
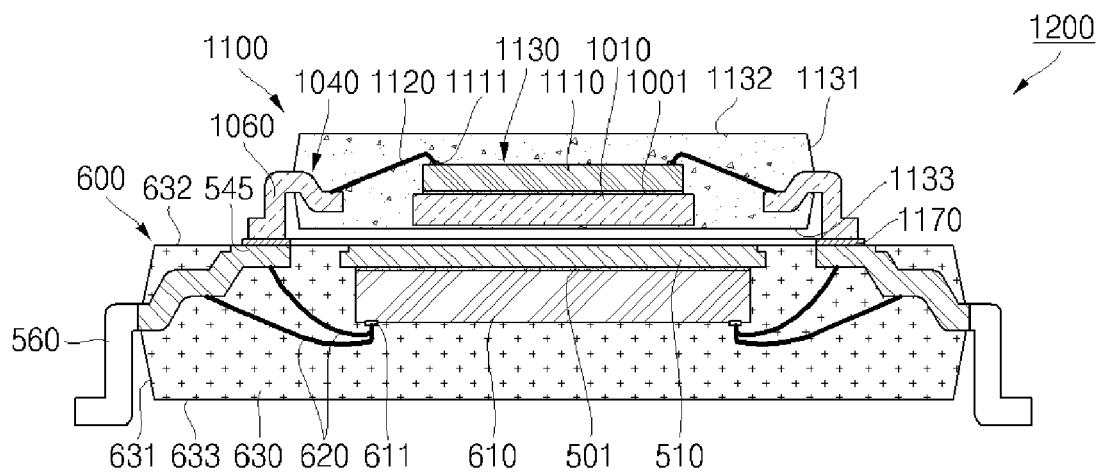
FIG. 12 is a cross-sectional view of a semiconductor package constructed in accordance with a sixth embodiment of the present invention.

Referring now to FIG. 12, there is shown a semiconductor package 1200 constructed in accordance with a sixth embodiment of the present invention. The semiconductor package 1200 comprises the above-described semiconductor package 600 in combination with a second semiconductor package 1100 stacked thereon.

In the semiconductor package 1200, the semiconductor package 1100 includes a generally quadrangular die pad 1010. In addition to the die pad 1010, the semiconductor package 1100 includes a plurality of leads 1040 which are disposed in spaced relation to the peripheral edge segments of the die pad 1010 and are preferably arranged to substantially circumvent the same. Each of the leads 1040 includes an integral outer portion 1060.

In addition to the foregoing, the semiconductor package 1100 comprises a semiconductor die 1110 which is attached to the top surface of the die pad 1010 through the use of an adhesive layer 1001. Disposed on the top surface of the semiconductor die 1110 is a plurality of bond pads 1111 which are electrically connected to respective ones of the leads 1040 through the use of conductive wires 1120.

In the semiconductor package 1100, the die pad 1010, the leads 1040, the semiconductor die 1110 and the conductive wires 1120 are at least partially encapsulated with an encapsulant material which, upon hardening, forms a package body 1130 of the semiconductor package 1100. The package body 1130 is formed such that the outer portions 1060 of the leads 1040 protrude from respective side surfaces 1131 of the package body 1130. In the semiconductor package 1100, no structural features thereof are exposed in the generally planar top surface 1132 of the package body 1130.

In the semiconductor package 1200, the semiconductor package 1100 is stacked on and electrically connected to the semiconductor package 600. More particularly, the lands 545 exposed in the top surface 632 of the package body 630 in the semiconductor package 600 are electrically connected to respective ones of the exposed, bent outer portions 1060 of the leads 1040. Such electrical connection as preferably facilitated through the use of solder paste 1170. Since the semiconductor package 1200 has a structure in which the semiconductor package 1100 is stacked on the semiconductor package 600, such semiconductor package 1200 is suitable for applications in various fields, such as semiconductor packages with high capacity and better performance. In addition, the mounting area of the semiconductor package 1200 on an external device can be reduced as compared to the mounting area which would be required by the semiconductor package 600 and semiconductor package 1100 separately.

Figure 13:
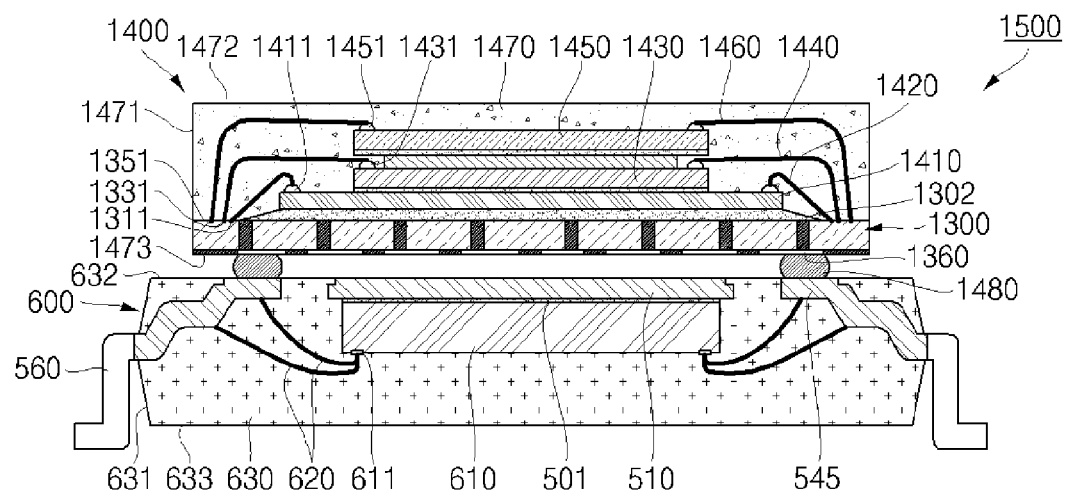
FIG. 13 is a cross-sectional view of a semiconductor package constructed in accordance with a seventh embodiment of the present invention.

Referring now to FIG. 13, there is shown a semiconductor package 1500 constructed in accordance with a seventh embodiment of the present invention. The semiconductor package 1500 comprises the above-described semiconductor package 600 in combination with a second semiconductor package 1400 stacked thereon.

In the semiconductor package 1500, the semiconductor package 1400 comprises a generally quadrangular circuit board 1300 having a top surface including a circuit pattern, a bottom surface including a circuit pattern, and via holes 1302 extending between the top and bottom surfaces to interconnect the circuit patterns to each other. The circuit board 1300 also has a first conductive pattern 1311, a second conductive pattern 1331, and a third conductive pattern 1351 which are each disposed on the top surface thereof.

The semiconductor package 1400 further comprises a first semiconductor die 1410, a second semiconductor die 1430 and a third semiconductor die 1450 which are sequentially attached to the top surface of the circuit board 1300. First bond pads 1411 are disposed on the top surface of the first semiconductor die 1410, with second bond pads 1431 being disposed on the top surface of the second semiconductor die 1430 and third bond pads 1451 being disposed on the top surface of the third semiconductor die 1450. First conductive wires 1420 are used to electrically connect the first bond pads 1411 of the first semiconductor die 1410 to the first conductive pattern 1311 of the circuit board 1300. Similarly, second conductive wires 1440 are used to electrically connect the second bond pads 1431 of the second semiconductor die 1430 to the second conductive pattern 1331 of the circuit board 1300, with third conductive wires 1460 being used to electrically connect the third bond pads 1451 of the third semiconductor die 1450 to the third conductive pattern 1351 of the circuit board 1300.

In the semiconductor package 1400, the circuit board 1300, the first, second and third semiconductor dies 1410, 1430, 1450, and the first, second and third conductive wires 1420, 1440, 1460 are encapsulated with an encapsulant material which, upon hardening, forms a package body 1470 of the semiconductor package 1400. Ball lands 1360 are formed at portions of the bottom surface of the circuit board 1300 to provide passages through which the semiconductor package 1400 is electrically connected to the semiconductor package 600.

In the semiconductor package 1500, the semiconductor package 1400 is stacked on and electrically connected to the semiconductor package 600. More particularly, the lands 545 exposed in the top surface 632 of the package body 630 in the semiconductor package 600 are electrically connected to respective ones of the ball lands 1360 of the circuit board 1300 through the use of solder balls 1480. Since the semiconductor package 1500 has a structure in which the semiconductor package 1400 is stacked on the semiconductor package 600, such semiconductor package 1500 is suitable for applications in various fields, such as semiconductor packages with high capacity and better performance. In addition, the mounting area of the semiconductor package 1500 on an external device can be reduced as compared to the mounting area which would be required by the semiconductor package 600 and semiconductor package 1400 separately.

Figure 14:
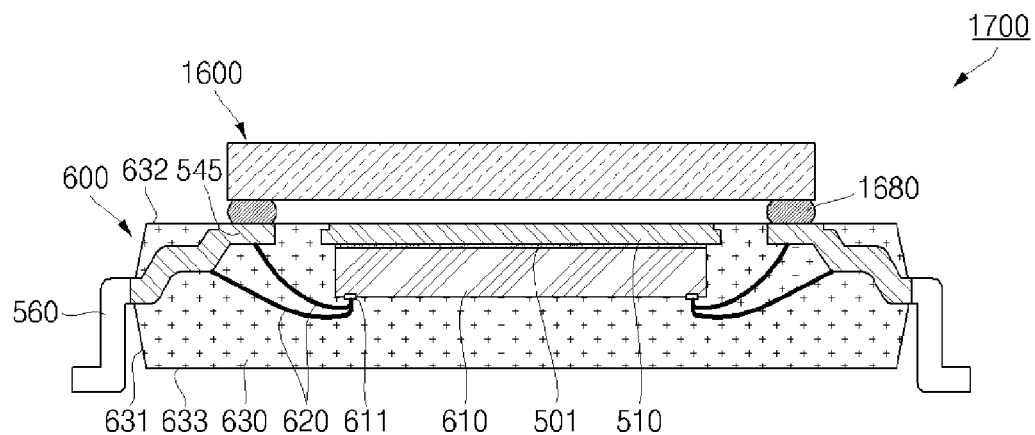
FIG. 14 is a cross-sectional view of a semiconductor package constructed in accordance with an eighth embodiment of the present invention.

Referring now to FIG. 14, there is shown a semiconductor package 1700 constructed in accordance with an eighth embodiment of the present invention. The semiconductor package 1700 comprises the above-described semiconductor package 600 in combination with a semiconductor die 1600.

In the semiconductor package 1700, a semiconductor die 1600 is stacked on and electrically connected to the semiconductor package 600. More particularly, the lands 545 exposed in the top surface 632 of the package body 630 in the semiconductor package 600 are electrically connected to the semiconductor die 1600 through the use of solder bumps 1680. Since the semiconductor package 1700 has a structure in which the semiconductor die 1600 is stacked on the semiconductor package 600, such semiconductor package 1700 is suitable for applications in various fields, such as semiconductor packages with high capacity and better performance. In addition, the mounting area of the semiconductor package 1700 on an external device can be reduced as compared to the mounting area which would be required by the semiconductor package 600 and semiconductor die 1600 separately.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a generally planar die pad defining multiple peripheral edge segments;
   a plurality of first leads which each include first and second downsets formed therein in spaced relation to each other, the first leads being segregated into at least two sets which extend along respective ones of at least two peripheral edge segments of the die pad;
   a plurality of second leads, at least some of which include a downset formed therein, the second leads being segregated into at least two sets which extend along respective ones of at least two peripheral edge segments of the die pad;
   a semiconductor die attached to the die pad and portions of the first leads, the semiconductor die being electrically connected to at least one of each of the first and second leads; and
   a package body defining a generally planar bottom surface and multiple side surfaces, the package body at least partially encapsulating the first and second leads and the semiconductor die such that the first and second downsets of the first leads and the downsets of the second leads are covered by the package body, at least portions of the die pad and the first leads are exposed in and substantially flush with the bottom surface of the package body, and portions of at least some of the second leads protrude from at least one of the side surfaces of the package body.

2. The semiconductor package of claim 1 wherein the die pad has a generally quadrangular configuration, and the first and second leads are segregated into at least four sets which each extend along a respective one of the peripheral edge segments of the die pad.

3. The semiconductor package of claim 2 wherein the semiconductor die is electrically connected to the first and second leads by conductive wires which are covered by the package body.

4. The semiconductor package of claim 3 wherein:
   each of the first leads includes a first segment, a second segment defining a wire bond area, and a third segment, the first segment being disposed between the first downset and the die pad and defining a land which is exposed in the bottom surface of the package body, the first downset extending between the first and second segments, and the second downset extending between the second and third segments;

each of the second leads includes a first segment which defines a wire bond area, and a second segment, the downset of each of the second leads extending between the first and second segments thereof; and the conductive wires extend from the semiconductor die to respective ones of the wire bond areas of the first and second leads.

5. The semiconductor package of claim 4 wherein the first segment of each of the first leads includes a top surface, a bottom surface which defines the land, a locking surface which is recessed relative to the bottom surface and covered by the package body, the land being disposed between the locking surface and the first downset.

6. The semiconductor package of claim 5 wherein the die pad includes a generally planar bottom surface and a locking surface which is recessed relative to the bottom surface thereof, the locking surface of the die pad being generally coplanar with the locking surfaces of the first leads and covered by the package body.

7. The semiconductor package of claim 5 wherein the top surface of each of the first leads includes art inner end portion which is disposed in opposed relation to the locking surface, and the semiconductor die is attached to the inner end portion of each of the first leads.

8. The semiconductor package of claim 7 further comprising at least two tie bars attached to and extending from the die pad, each of the tie bars including a top surface and a bottom surface which is at least partially exposed in the bottom surface of the package body, the semiconductor being attached to a portion of the top surface of each of the tic bars.

9. The semiconductor package of claim 4 wherein:

the die pad and the first segments of the first leads extend along a first plane;

the wire bond areas of the first and second leads each extend along a second plane which is disposed in spaced, generally parallel relation to the first plane; and the third segments of the first leads, the second segments of the second leads, and the portions of the second leads which protrude from the package body each extend along a third plane which is disposed in spaced, generally parallel relation to the second plane such that the second plane extends between the first and third planes.

10. The semiconductor package of claim 9 wherein the portions of the second leads which protrude from respective ones of the side surfaces of the package body are bent to assume a gull-wing configuration.

11. A semiconductor package comprising:

a generally planar die pad;

a plurality of first leads which each include first and second downsets formed therein in spaced relation to each other, the first leads being disposed in spaced relation to the die pad;

a plurality of second leads, at least some of which include a downset formed therein, the second leads being disposed in spaced relation to the die pad;

a semiconductor die attached to the die pad and portions of the first leads, the semiconductor die being electrically connected to at least one of each of the first, and second leads; and a package body defining a opposed, generally planer top and, bottom surfaces, and multiple side surfaces, the package body at least partially encapsulating the first, and second leads and the semiconductor die such that the first and second downsets of the first leads and the downsets of the second leads are covered by the package body, at least portions of the die pad and the first leads are exposed in and substantially flush with one of the top and bottom surfaces of the package body, and portions of at least some of the second leads protrude from at least one of the side surfaces of the package body.

12. The semiconductor package of claim 11 wherein at least portions of the die pad and the first leads are exposed in and substantially flush with the top surface of the package body.

13. The semiconductor package of claim 12 further in combination with a second semiconductor package electrically connected to at least the portions of the first leads which are exposed in the top surface of the package body.

14. The semiconductor package of claim 11 wherein:

each of the first leads includes a first segment, a second segment defining a wire bond area, and a third segment, the first segment being disposed between the first downset and the die pad and defining a land which is exposed in the bottom surface of the package body, the first downset extending between the first and second segments, and the second downset extending between the second and third segments;

each of the second leads includes a first segment which defines a wire bond area, and a second segment, the downset of each of the second leads extending between the first and second segments thereof; and the semiconductor die is electrically connected to respective ones of the wire bond areas of the first and second leads by conductive wires which are covered by the package body.

15. The semiconductor package of claim 14 wherein the first segment of each of the first leads includes a top surface having an inner end portion, a bottom surface which defines the land, and a locking surface which is recessed relative to the bottom surface and disposed in opposed relation to the inner end portion, the locking surface being covered by the package body, with the semiconductor die being attached to the inner end portion of each of the first leads.

16. The semiconductor package of claim 15 wherein the die pad includes a generally planar bottom surface and a locking surface which is recessed relative to the bottom surface thereof, the locking surface of the die pad being generally coplanar with the locking surfaces of the first leads and covered by the package body.

17. The semiconductor package of claim 15 further comprising at least two tie bars attached to and extending from the die pad, each of the tie bars including a top surface and a bottom surface which is at least partially exposed in the bottom surface of the package body, the semiconductor being attached to a portion of the top surface of each of the tie bars.

18. The semiconductor package of claim 14 wherein:

the die pad and the first segments of the first leads extend along a first plane;

the wire bond areas of the first and second leads each extend along a second plane which is disposed in spaced, generally parallel relation to the first plane; and the third segments of the first leads, the second segments of the second leads, and the portions the second leads which protrude from the package body each extend along a third plane which is disposed in spaced, generally parallel relation to the second plane such that the second plane extends between the first and third planes.

19. A semiconductor package comprising:

a generally planar die pad defining opposed top and bottom surfaces and multiple peripheral edge segments;

a plurality of first leads which each define a land and include first and second downsets formed therein in spaced relation to each other, the first leads being segregated into at least two sets which extend along respective ones of at least two peripheral edge segments of the die pad;

a plurality of second leads, at least some of which include a downset formed therein, the second leads being segregated into at least two sets which extend along respective ones of at least two peripheral edge segments of the die pad;

a semiconductor die attached to the die pad, the semiconductor die being electrically connected to at least one of each of the first and second leads; and a package body defining opposed top and bottom surfaces and multiple side surfaces, the package body at least partially encapsulating the first and second leads and the semiconductor die such that the first and second downsets of the first leads and the downsets of the second leads are covered by the package body, the bottom surface of the die pad and the lands of the first leads are exposed in and substantially flush with one of the top and bottom surfaces of the package body, and portions of the second leads protrude from at least one of the side surfaces of the package body toward one of the ton and bottom surfaces thereof.

20. The semiconductor package of claim 19 further in combination with a second semiconductor package electrically connected to the exposed land and the exposed bottom surface of the die pad of the semiconductor package.

21. The semiconductor package of claim 19 wherein the semiconductor die is also attached to portions of the first leads.

* * * * *